US012615725B2

(12) United States Patent
Huang et al.

(10) Patent No.: US 12,615,725 B2
(45) Date of Patent: Apr. 28, 2026

(54) INFORMATION HANDLING SYSTEM MULTI MOUNT OPTION MOUNTING SYSTEM

(71) Applicant: Dell Products L.P., Round Rock, TX (US)

(72) Inventors: Chin-An Huang, New Taipei City (TW); Chien-Tung Huang, New Taipei City (TW); Richard W. Guzman, Lago Vista, TX (US); Shan-Yi Chang, Taoyuan City (TW)

(73) Assignee: Dell Products L.P., Round Rock, TX (US)

( * ) Notice: Subject to any disclaimer, the term of this patent is extended or adjusted under 35 U.S.C. 154(b) by 250 days.

(21) Appl. No.: 18/208,172

(22) Filed: Jun. 9, 2023

(65) Prior Publication Data

US 2024/0414857 A1 Dec. 12, 2024

(51) Int. Cl.
*H05K 5/02* (2006.01)
*G06F 1/16* (2006.01)

(52) U.S. Cl.
CPC .............. *H05K 5/0204* (2013.01); *G06F 1/16* (2013.01)

(58) Field of Classification Search
CPC ........ F16M 13/02; F16M 11/041; H05K 5/30; H05K 7/023; H05K 7/14; H02B 1/052; A47B 2097/005
See application file for complete search history.

(56) References Cited

U.S. PATENT DOCUMENTS

| | | | | |
|---|---|---|---|---|
| 7,377,603 | B2 * | 5/2008 | Quijano | G06F 1/181 |
| | | | | 312/223.1 |
| 10,492,316 | B2 * | 11/2019 | Sung | G06F 1/1601 |
| 2013/0264919 | A1 * | 10/2013 | Sullivan | G06F 1/181 |
| | | | | 312/223.2 |

* cited by examiner

*Primary Examiner* — James Wu
(74) *Attorney, Agent, or Firm* — Terrile, Cannatti & Chambers, LLP; Stephen A. Terrile

(57) ABSTRACT

A system and method for performing an information handling system multi mount option mounting operation. The information handling system multi mount option mounting operation is performed by an information handling system multi mount option mounting system which includes a a base panel, the base panel comprising a symmetric mounting feature, the symmetric mounting feature comprising a plurality of mounting apertures; and, an alignment feature, alignment feature comprising a plurality of mounting slots, the plurality of mounting slots being configured to interact with alignment features of an information handing system chassis when the information handling system chassis is attached to the information handling system multi mount option mounting component; and wherein the information handling system multi mount option mounting component enables mounting of an information handing system via any of a plurality of different mounting options.

18 Claims, 41 Drawing Sheets

300
324
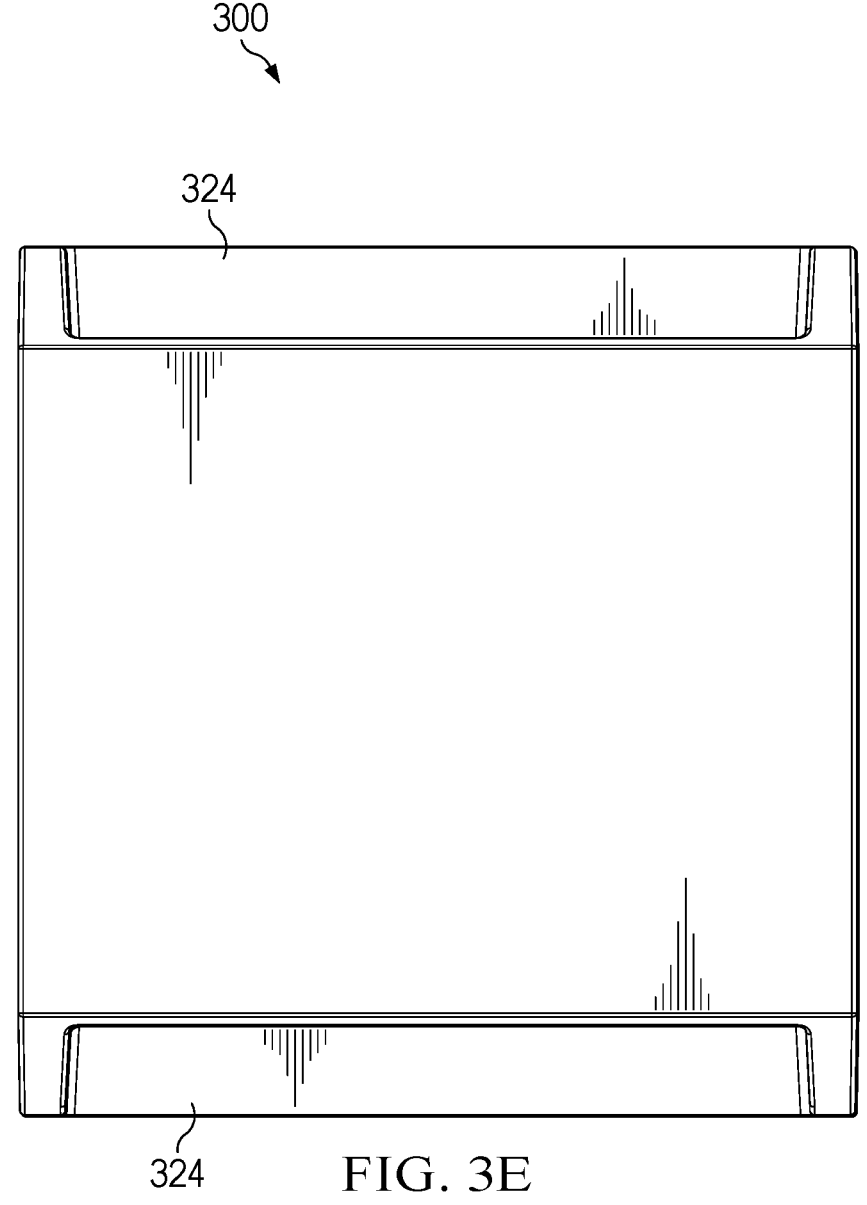
324     FIG. 3E

500

500

620

1110

1140

1120

1132

1130

INFORMATION HANDLING SYSTEM MULTI MOUNT OPTION MOUNTING SYSTEM

BACKGROUND OF THE INVENTION

Field of the Invention

The present invention relates to information handling systems. More specifically, embodiments of the invention relate to a mounting system for use with an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

A system, method, and computer-readable medium are disclosed for performing a multi mount information handling system mounting operation.

More specifically, in one embodiment the invention relates to an information handling system multi mount option mounting component, comprising: a base panel, the base panel comprising a symmetric mounting feature, the symmetric mounting feature comprising a plurality of mounting apertures; and, an alignment feature, alignment feature comprising a plurality of mounting slots, the plurality of mounting slots being configured to interact with alignment features of an information handing system chassis when the information handling system chassis is attached to the information handling system multi mount option mounting component; and wherein the information handling system multi mount option mounting component enables mounting of an information handing system via any of a plurality of different mounting options.

In another embodiment the invention relates to an information handling system multi mount option mounting system, comprising: an information handling system multi mount option mounting component, comprising: a base panel, the base panel comprising a symmetric mounting feature, the symmetric mounting feature comprising a plurality of mounting apertures; and, an alignment feature, alignment feature comprising a plurality of mounting slots, the plurality of mounting slots being configured to interact with alignment features of an information handing system chassis when the information handling system chassis is attached to the information handling system multi mount option mounting component; and wherein the information handling system multi mount option mounting component enables mounting of an information handing system via any of a plurality of different mounting options.

In another embodiment the invention relates to a system comprising: an information handling system, the information handling system comprising a processor; a data bus coupled to the processor; a memory coupled to the processor; and a chassis, the chassis containing the processor and the memory; and an information handling system mounting system, comprising; an information handling system multi mount option mounting component, comprising: a base panel, the base panel comprising a symmetric mounting feature, the symmetric mounting feature comprising a plurality of mounting apertures; and, an alignment feature, alignment feature comprising a plurality of mounting slots, the plurality of mounting slots being configured to interact with alignment features of an information handing system chassis when the information handling system chassis is attached to the information handling system multi mount option mounting component; and wherein the information handling system multi mount option mounting component enables mounting of an information handing system via any of a plurality of different mounting options.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 3A, 3B, 3C, 3D, 3E and 3F, generally referred to as FIG. 3, respectively show top bottom, left, right, front and rear, views of a multi mount option side panel mounting component in accordance with the present disclosure.

DETAILED DESCRIPTION

Figure 1:
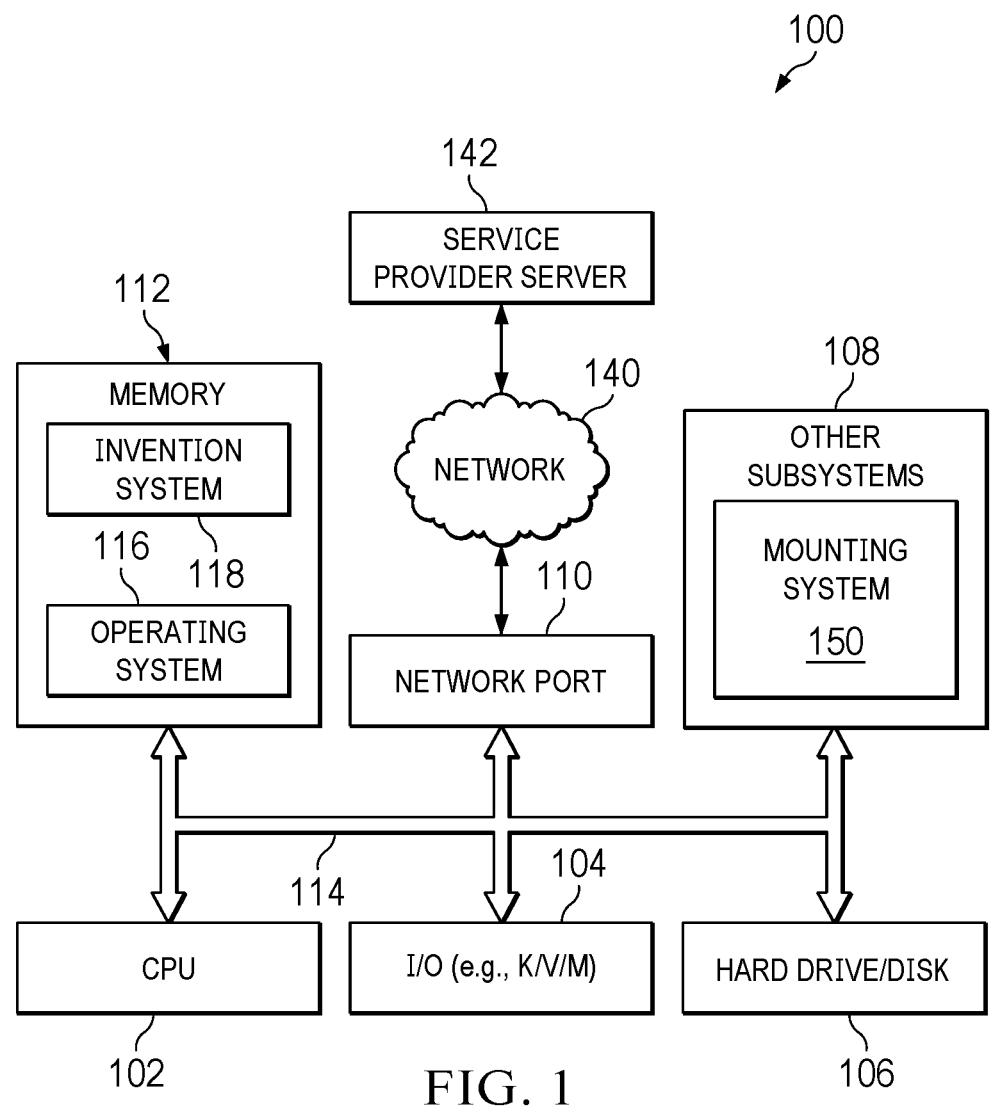
FIG. 1 shows a general illustration of components of an information handling system as implemented in the system and method of the present invention.
Figure 2A:
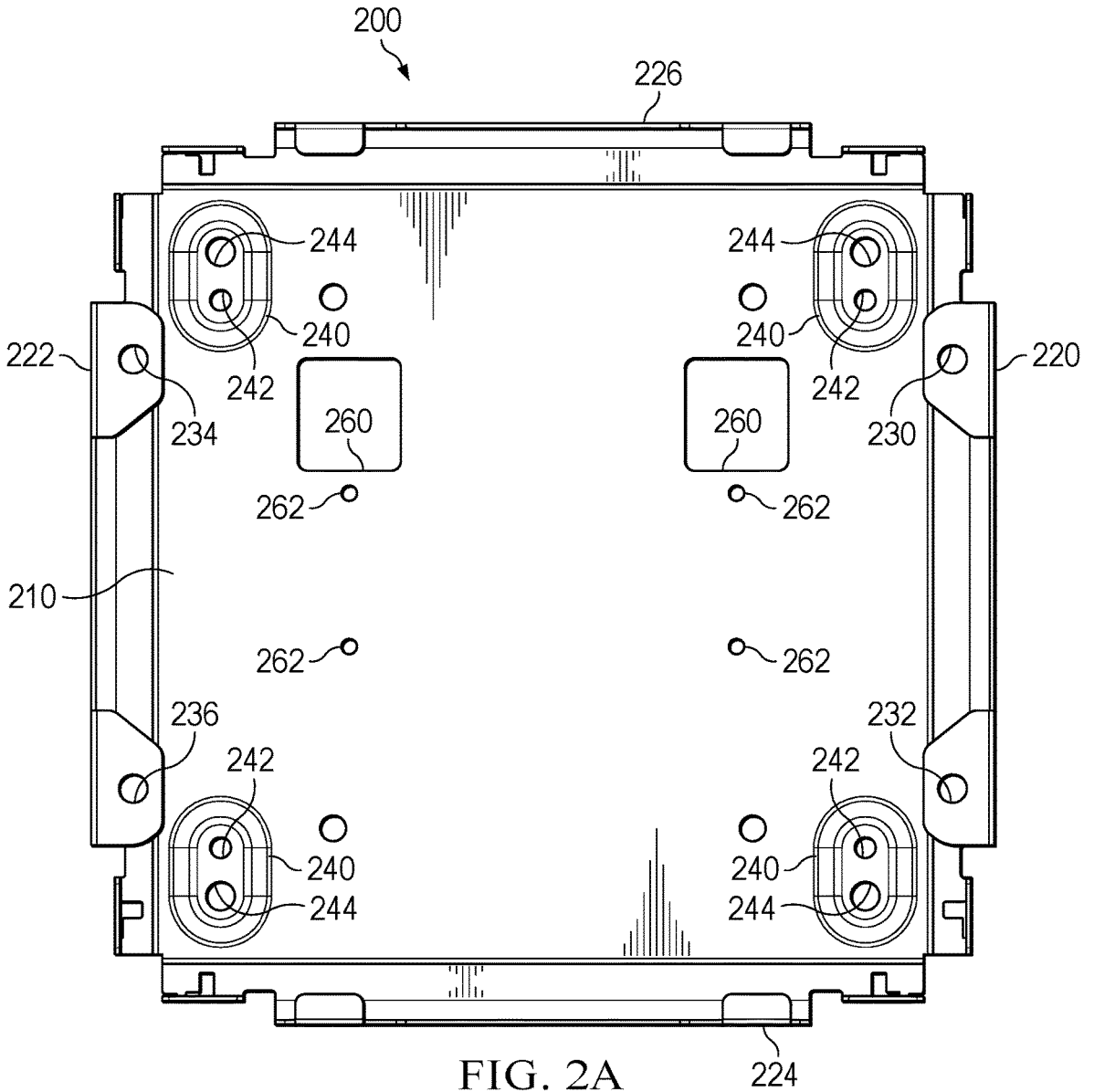
FIGS. 2A, 2B, 2C, 2D, 2E and 2F, generally referred to as FIG. 2, respectively show top bottom, left, right, front and rear, views of a multi mount option mounting bracket component in accordance with the present disclosure.
Figure 2B:
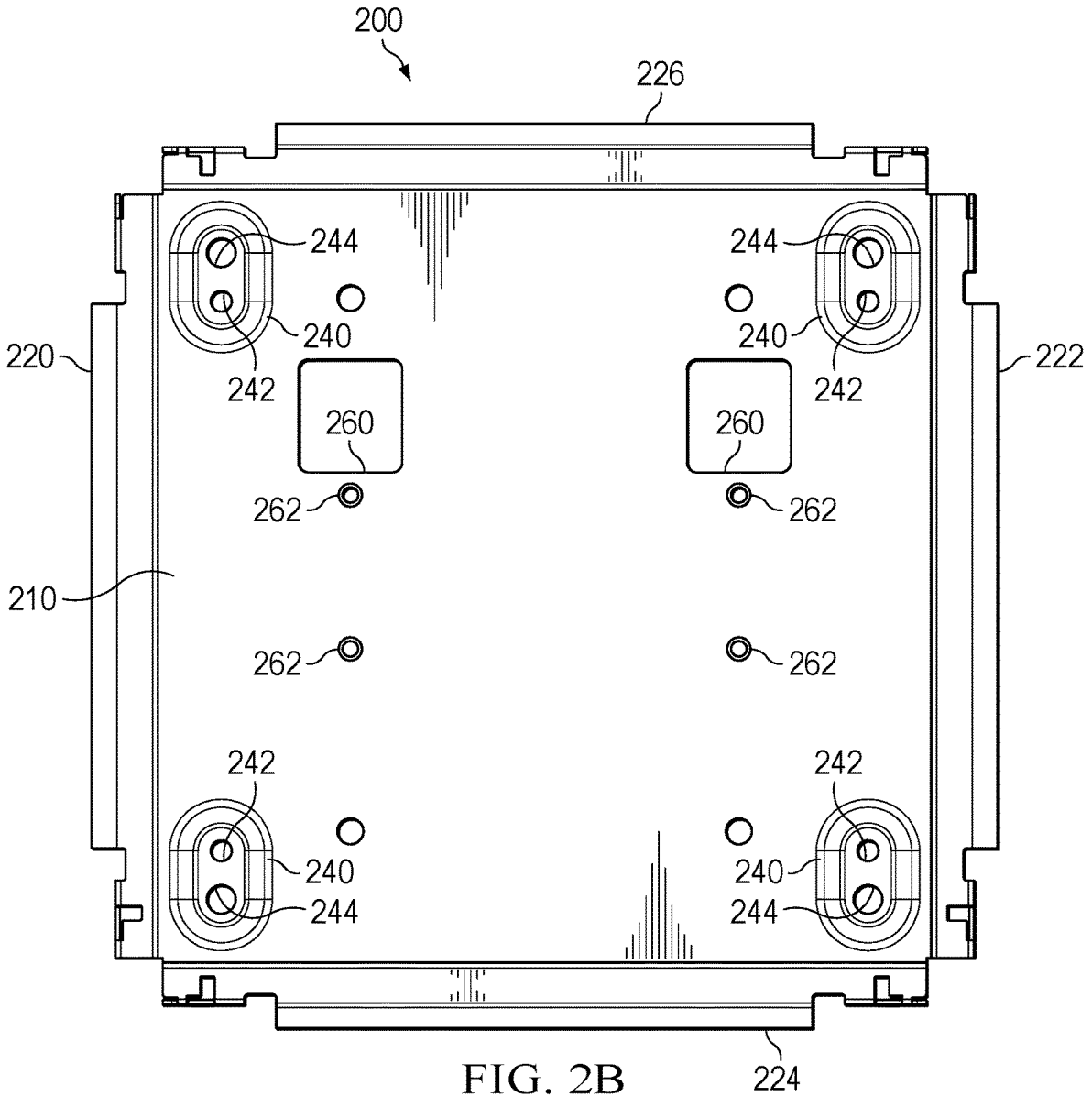
Figure 2C:
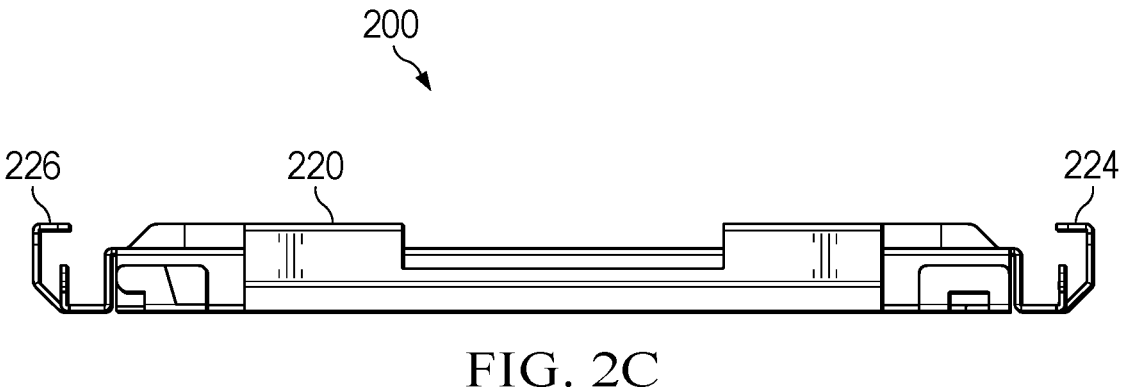
Figure 2D:
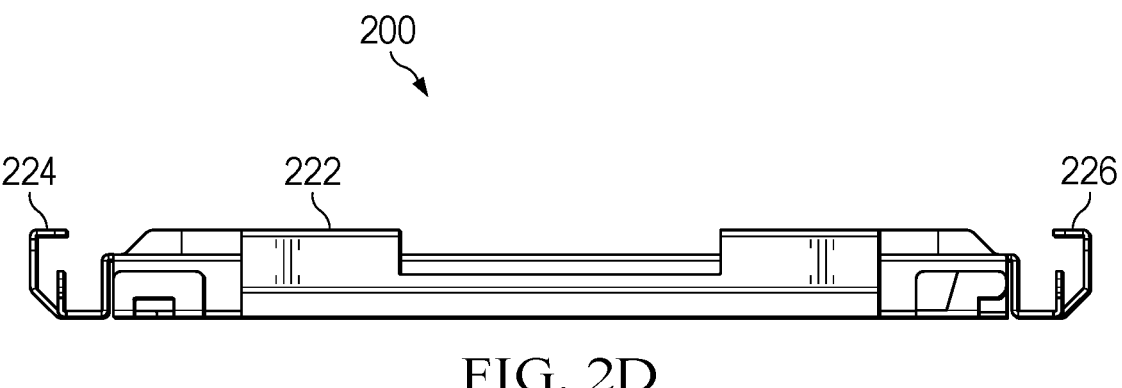
Figure 2E:
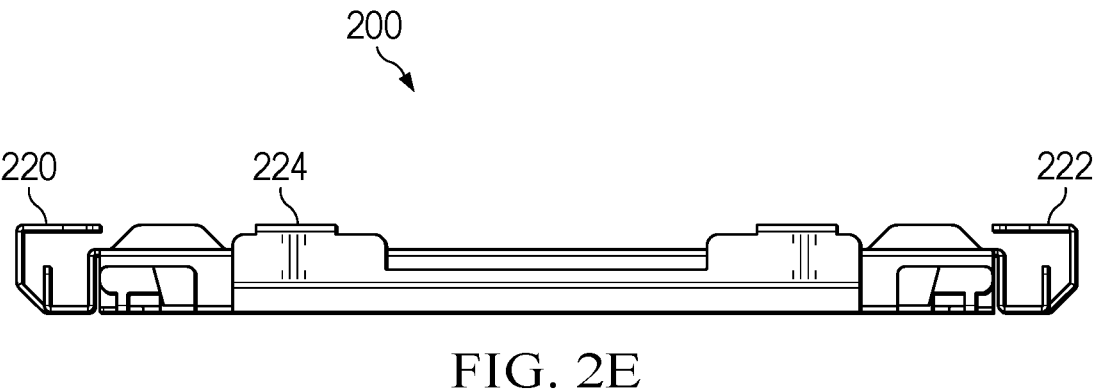
Figure 2F:
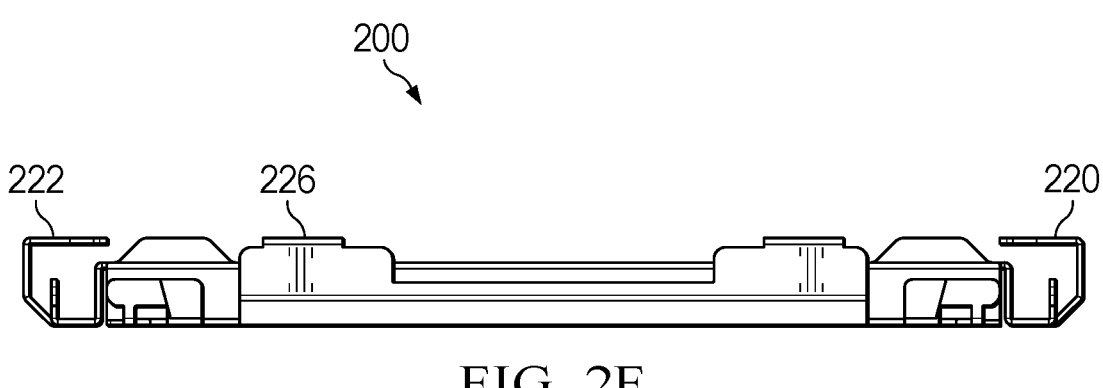
Figure 2G:
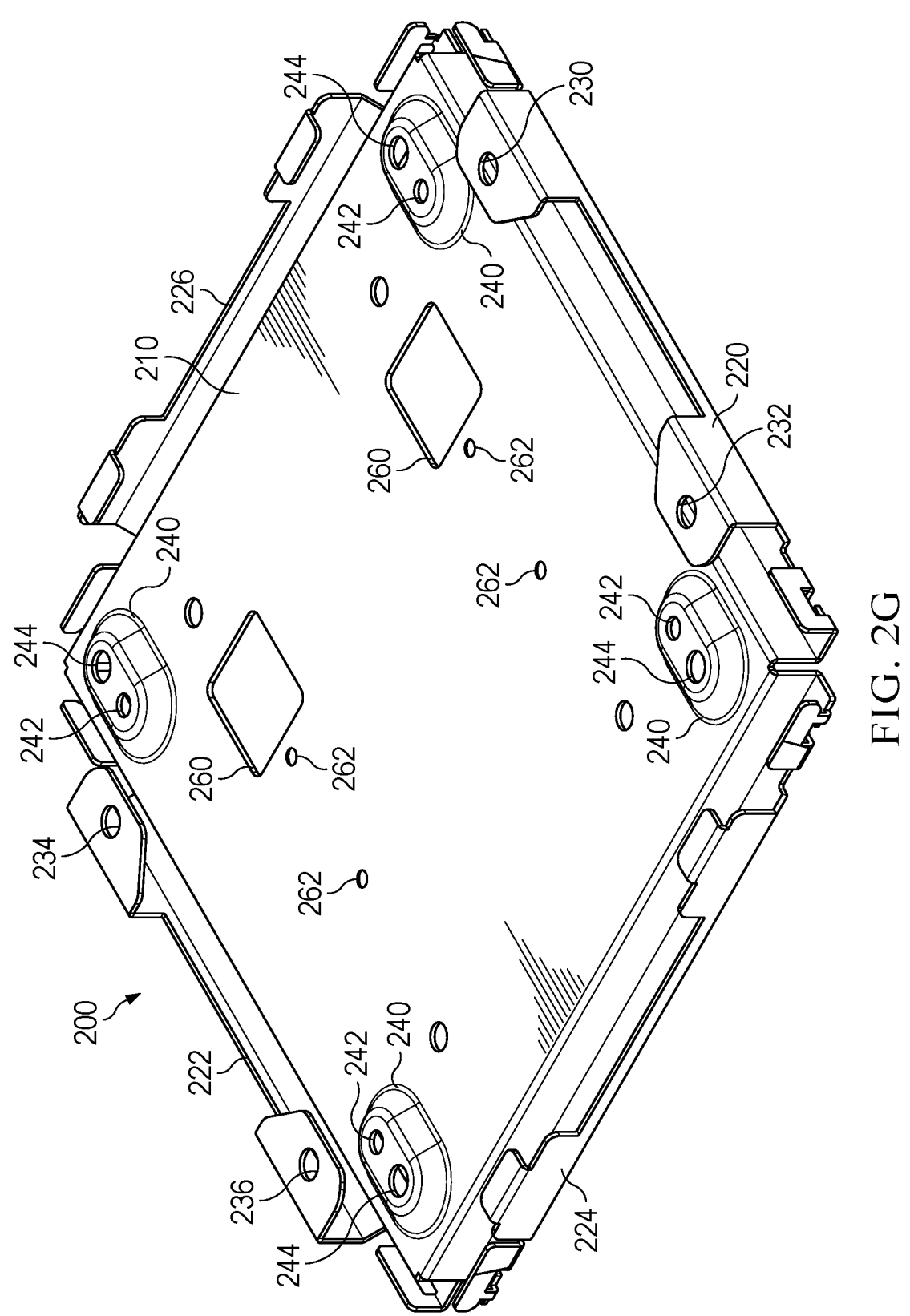
FIG. 2G, generally referred to as FIG. 2, shows a top perspective view of a multi mount option mounting bracket component in accordance with the present disclosure.
Figure 2H:
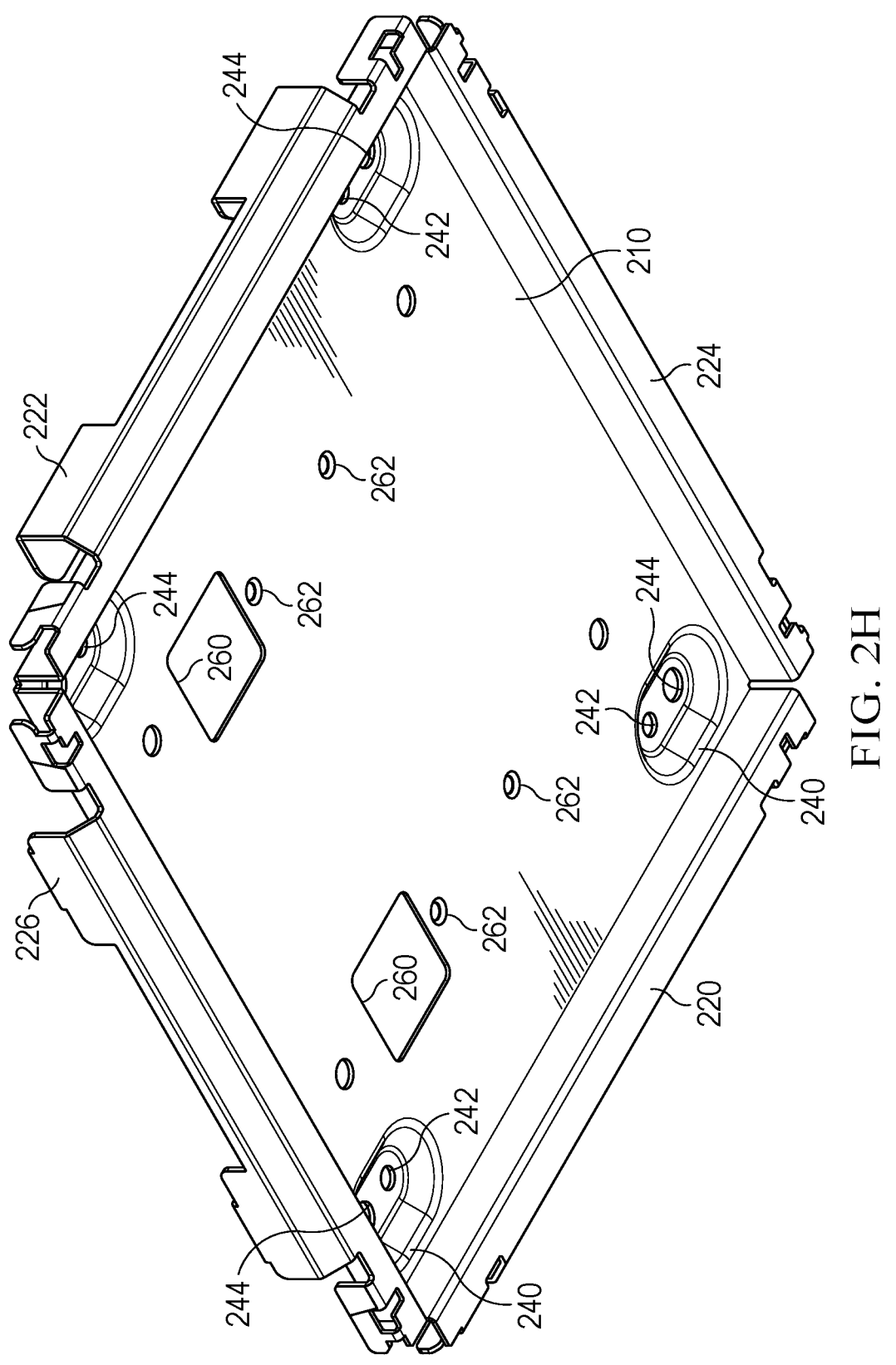
FIG. 2H, generally referred to as FIG. 2, shows a bottom perspective view of a multi mount option mounting bracket component in accordance with the present disclosure.
Figure 3B:
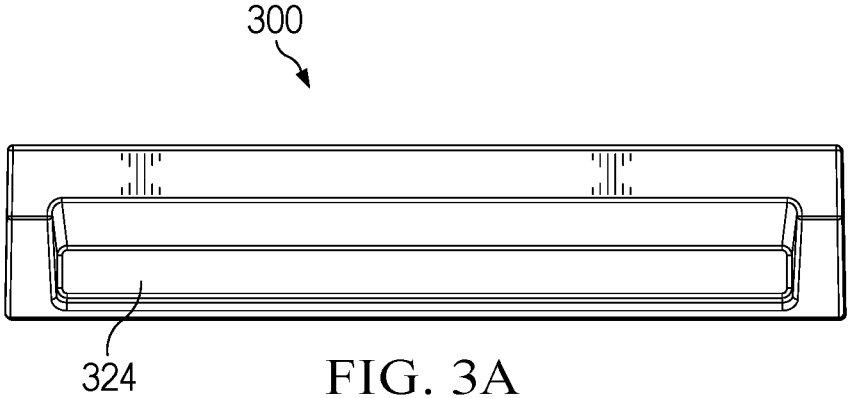
Figure 3B:
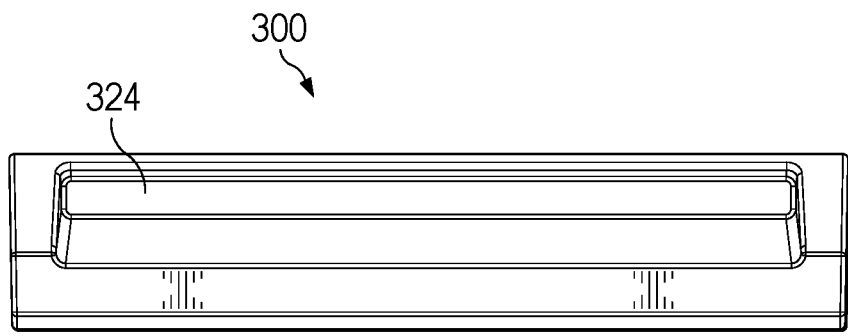
Figure 3C:
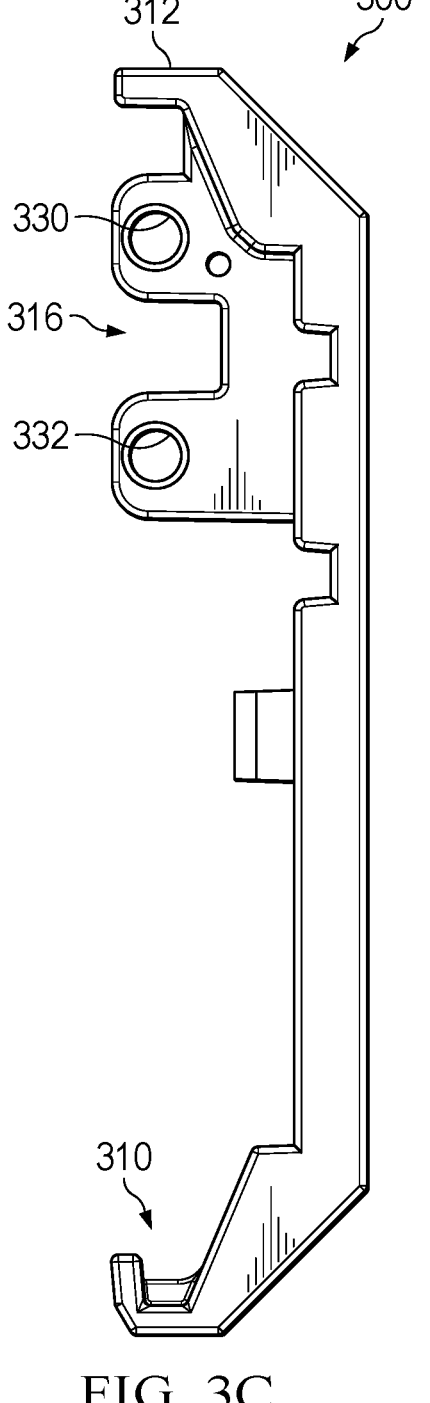
Figure 3D:
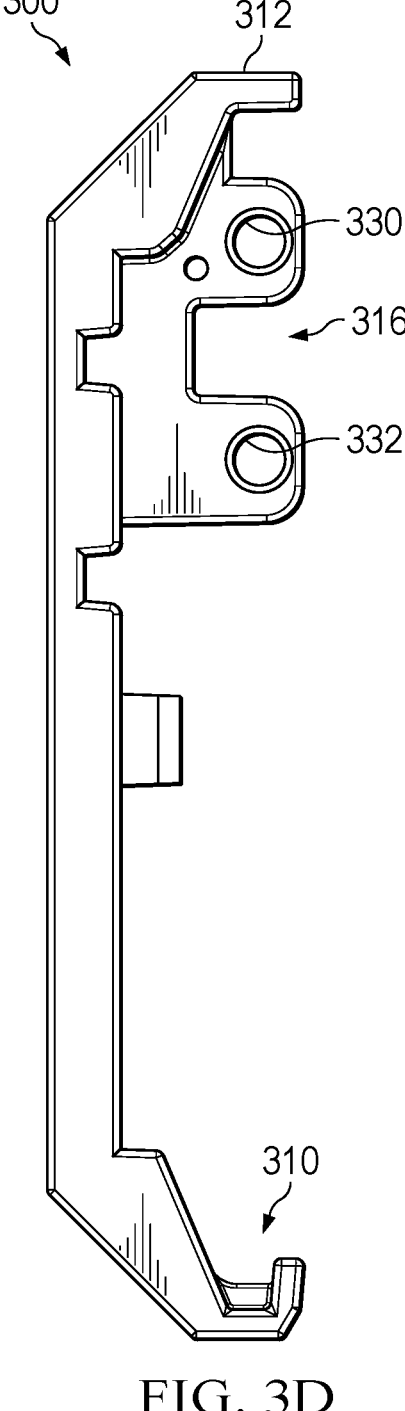
Figure 3F:
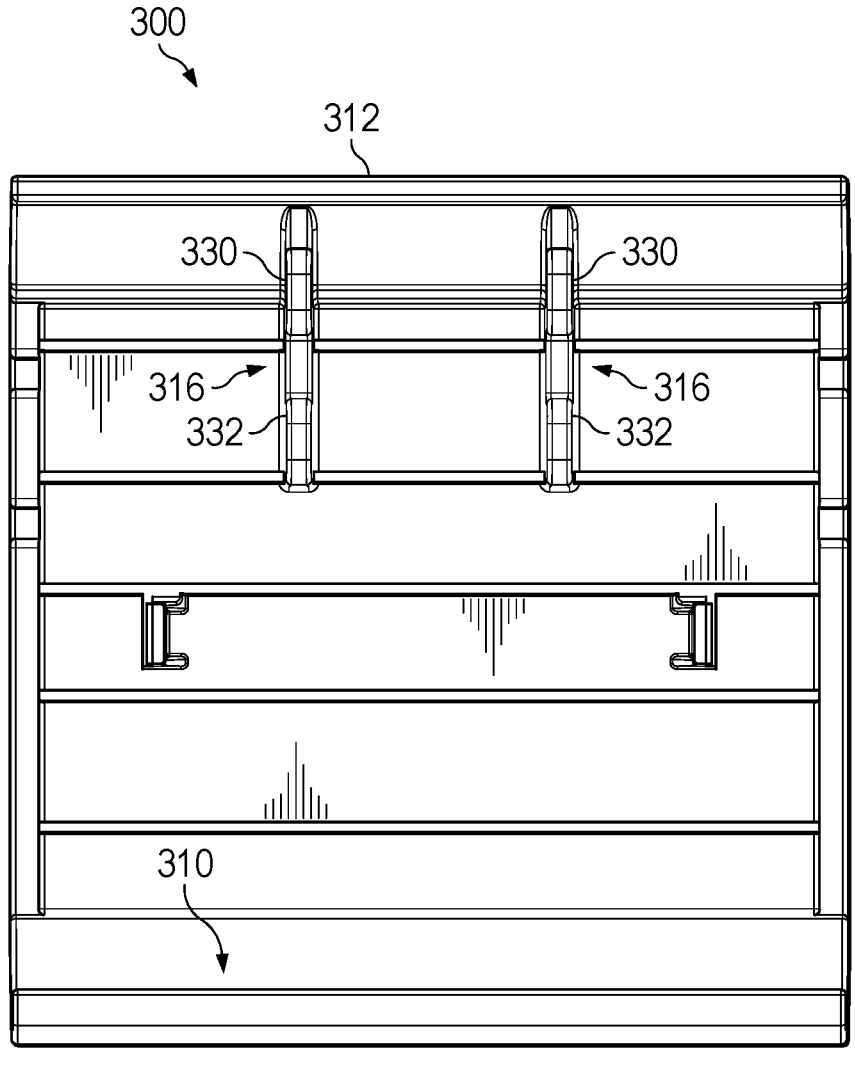
Figure 3G:
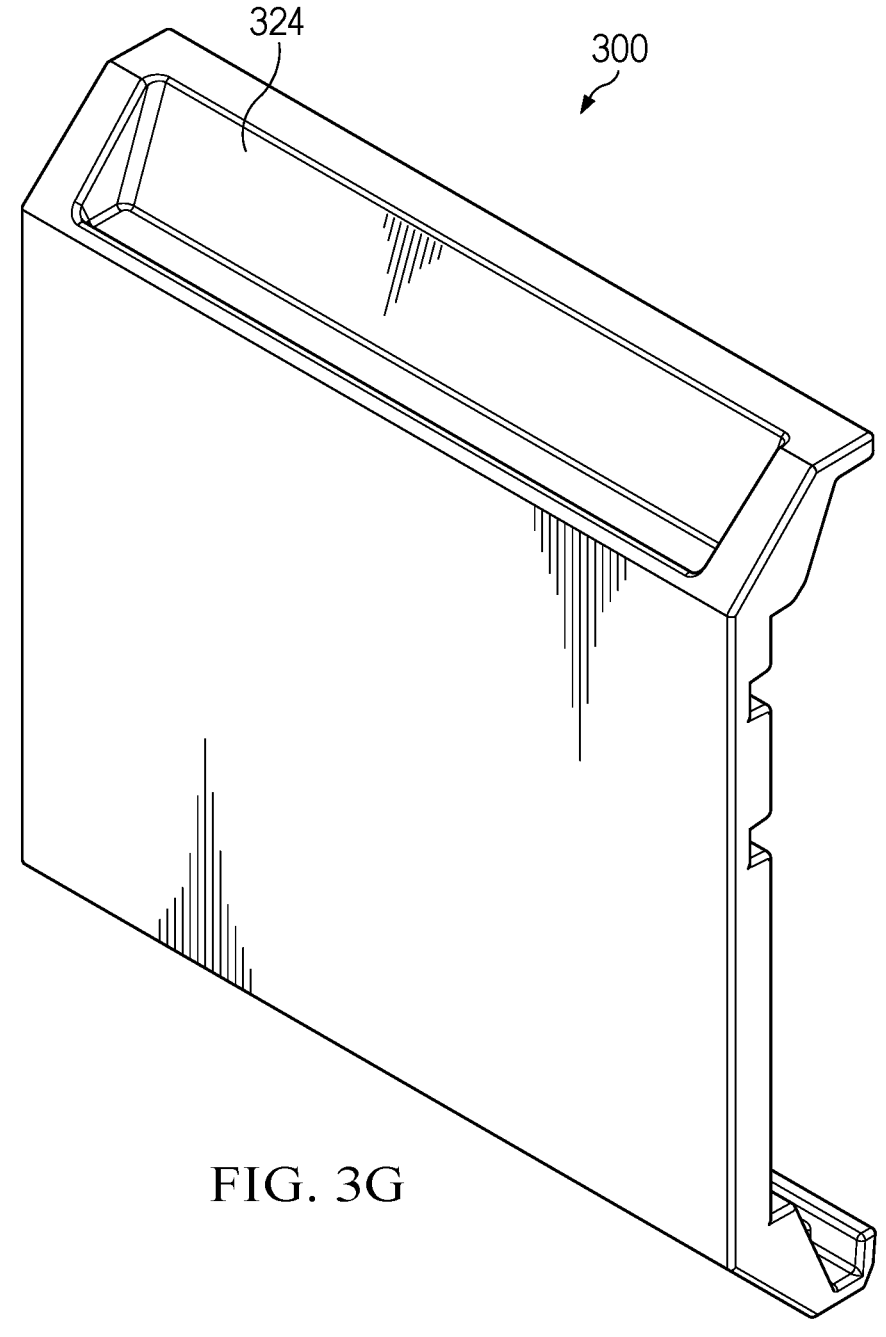
FIG. 3G, generally referred to as FIG. 3, shows a top perspective view of a multi mount option side panel mounting component in accordance with the present disclosure.
Figure 3H:
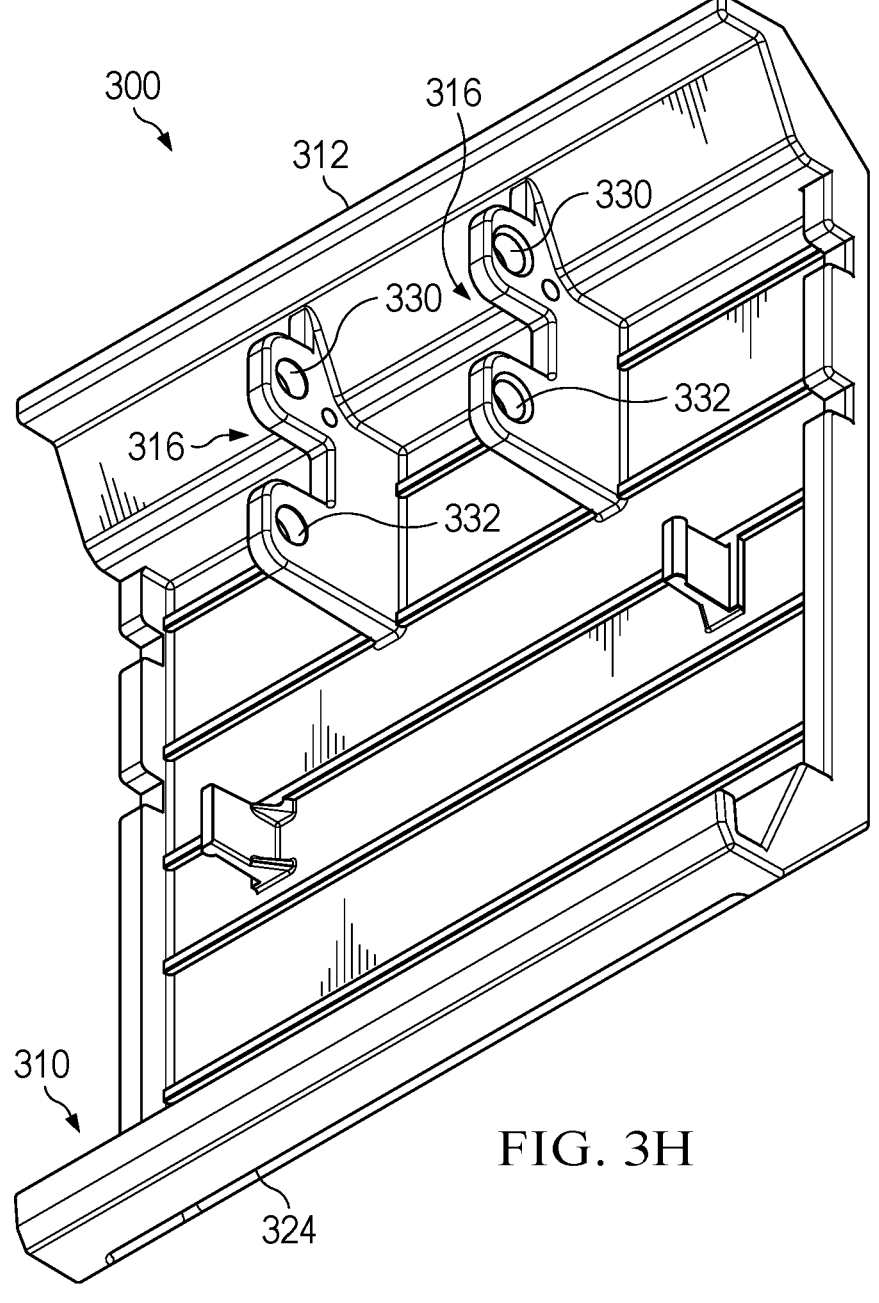
FIG. 3H, generally referred to as FIG. 3, shows a bottom perspective view of a multi mount option side panel mounting component in accordance with the present disclosure.

Certain aspects of the disclosure reflect an appreciation that it can be desirable to provide an information handling system chassis, such as a server type information handling system chassis which can be mounted via any of a plurality of options to support different application circumstances. Certain aspects of the disclosure reflect an appreciation that it can be desirable to provide a common mounting design to simplify mounting complexities. Certain aspects of the disclosure reflect an appreciation that it can be desirable to provide a mounting design which satisfies standard shock and vibration standards, military specification requirements and network equipment building system (NEBS) specification requirements.

A system and method are disclosed for performing multi mount option information handling system mounting operation. In certain embodiments, the multi mount option information handling system mounting operation uses multi mount optimized information handling system chassis, such as a server type information handling system chassis, and a multi mount option information handling system mounting system which can be mounted via any of a plurality of options to support different application circumstances.

In certain embodiments, the multi mount option information handling system mounting operation uses a multi mount option information handling system mounting system to mount the information handling system to any of a plurality of different mounting options. In certain embodiments, the plurality of different mounting operations include one or more of a table mount option, a ceiling mount option, a wall mount option, a display standard mount option, a rail standard mount option and a transit case mount option. In certain embodiments, the display standard mount option conforms to a video electronics standards association mount standard. In certain embodiments, the rail standard mount option conforms to a Deutsches Institute fur Normung mount standard. As used herein, the video electronics standards association (VESA) mount standard defines dimensions of the four-hole attachment interface on the back of displays and the screws used to fit those holes. As used herein, the Deutsches Institute fur Normung (DIN) rail standard defines a rail mount standard that is widely used inside equipment racks.

In certain embodiments, the multi mount option mounting system includes a multi mount bracket, a multi mount side panel, a multi mount optimized information handling system chassis or a combination thereof. In certain embodiments, the multi mount option mounting system supports an information handling system server type chassis with tool-less latch design to achieve different mount options. In certain embodiments, the multi mount option mounting system provides an information handling system chassis with tool-less chassis latching functionality. In certain embodiments, the multi mount bracket includes a single common bracket which has a plurality of symmetric mounting and alignment features for information handling system server type mounting in different orientations. In certain embodiments, the multi mount bracket includes a plurality of mounting holes and features to enable the bracket to be mounted via any of a plurality of different mounting options.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, a touchpad or touchscreen, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise a multi mount option mounting system 150.

In certain embodiments, the multi mount option mounting system 150 performs a multi mount option information handling system mounting operation. As used herein, an information handling system multi mount option mounting operation broadly refers to any task, function, procedure, or process performed, directly or indirectly, to mount an information handling system to surface using a multi mount option mounting system. In certain embodiments, the multi mount option information handling system mounting operation uses a multi mount optimized information handling system chassis, such as a server type information handling system chassis. In certain embodiments, the multi mount option mounting system can be mounted via any of a plurality of options to support different application circumstances.

In certain embodiments, the multi mount option information handling system mounting operation uses a multi mount option information handling system mounting system 150 to mount the information handling system to any of a plurality of different mounting options. In certain embodiments, the plurality of different mounting operations include one or more of a table mount option, a ceiling mount option, a wall mount option, a display standard mount option, a rail standard mount option and a transit case mount option. In certain embodiments, the display standard mount option conforms to a video electronics standards association mount standard. In certain embodiments, the rail standard mount option conforms to a Deutsches Institute fur Normung mount standard. As used herein, the video electronics standards association (VESA) mount standard defines dimensions of the four-hole attachment interface on the back of displays and the screws used to fit those holes. As used herein, the Deutsches Institute fur Normung (DIN) rail standard defines a rail mount standard that is widely used inside equipment racks.

In certain embodiments, the multi mount option mounting system 150 includes a multi mount bracket, a multi mount side panel, a multi mount optimized information handling system chassis or a combination thereof. In certain embodiments, the multi mount option mounting system 150 supports an information handling system server type with tool-less latch design to achieve different mount options. In certain embodiments, the multi mount option mounting system 150 provides an information handling system chassis with tool-less chassis latching functionality. In certain embodiments, the multi mount bracket includes a single common bracket which has a plurality of symmetric mounting and alignment features for information handling system server type mounting in different orientations. In certain embodiments, the multi mount bracket includes a plurality of mounting holes and features to enable the bracket to be mounted via any of a plurality of different mounting options.

FIGS. 2A, 2B, 2C, 2D, 2E and 2F, generally referred to as FIG. 2, respectively show top bottom, left, right, front and rear, views of a multi mount option mounting bracket component 200. FIG. 2G, generally referred to as FIG. 2, shows a top perspective view of a multi mount option mounting bracket component 200. FIG. 2H, generally referred to as FIG. 2, shows a bottom perspective view of a multi mount option mounting bracket component 200.

In certain embodiments, the multi mount option mounting bracket component 200 enables mounting an information handling system via any of a plurality of different mounting options. In certain embodiments, the plurality of different mounting operations include one or more of a table mount option, a ceiling mount option, a wall mount option, a display standard mount option, a rail standard mount option and a transit case mount option. In certain embodiments, the display standard mount option conforms to a video electronics standards association mount standard. In certain embodiments, the rail standard mount option conforms to a Deutsches Institute fur Normung mount standard. As used herein, the video electronics standards association (VESA) mount standard defines dimensions of the four-hole attachment interface on the back of displays and the screws used to fit those holes. As used herein, the Deutsches Institute fur Normung (DIN) rail standard defines a rail mount standard that is widely used inside equipment racks.

In certain embodiments, the multi mount bracket includes a single common bracket which has a plurality of symmetric mounting and alignment features for server chassis mounting in different orientations. In certain embodiments, the symmetric mounting feature of the multi mount bracket includes a plurality of mounting holes and features to enable the bracket to be mounted via any of a plurality of different mounting options. In certain embodiments, the plurality of mounting holes are symmetrically oriented about a vertical axis, a horizontal axis, or a combination thereof. In certain embodiments, the single common bracket is formed form a single piece of material.

In certain embodiments, the alignment feature of multi mount option mounting bracket component 200 includes one or more server mounting slots attached to a base panel 210 of the multi mount option mounting bracket component 200. In certain embodiments, the server mounting slots include a right side server mounting slot 220 and a left side server mounting slot 222. In certain embodiments, the right side server mounting slot 220 and the left side server mounting slot 222 are configured to interact with alignment features of a server chassis when the server chassis is physically attached to the multi mount option mounting bracket component 200. In certain embodiments, the server mounting slots include a front side server mounting slot 224 and a rear side server mounting slot 226. In certain embodiments, the front side server mounting slot 224 and rear side server mounting slot 226 are configured to interact with alignment features of a server chassis when the server chassis is mounted to the multi mount option mounting bracket component 200.

In certain embodiments, the right side server mounting slot 220 defines one or both right side shelf kit apertures 230, 232. In certain embodiments, the left side server mounting slot 220 defines one or both left side shelf kit apertures 234, 236. In certain embodiments some or all of the right side shelf kit apertures 230, 232 and the left side shelf kit apertures 234, 236 are configured as M6 nuts with a pitch of substantially (i.e., +/−20%) 133.4×254 mm.

In certain embodiments, a base panel of the multi mount option mounting bracket component 200 includes one or more foot projections 240 which project from a bottom of the base panel 210 of the multi mount option mounting bracket component 200. In certain embodiments, each foot projection 240 defines a set of mounting apertures. In certain embodiments, the set of mounting apertures includes a surface mounting aperture 242, a VESA mounting aperture 244, or a combination thereof. In certain embodiments, the surface mounting aperture 242 is used to attach the multi mount option mounting bracket component 200 to a surface. In certain embodiments, the surface comprises one or more of a table, a ceiling and a wall. In certain embodiments some or all of the surface mounting apertures 242 are configured as with a pitch of substantially (i.e., +/−20%) 170×200 mm. In certain embodiments, the VESA mounting aperture 244 is used to attach the multi mount option mounting bracket component 200 to a VESA compatible bracket. In certain embodiments some or all of the VESA mounting apertures 244 are configured as M6 nuts with a pitch of substantially (i.e., +/−20%) 200×200 mm. In certain embodiments, the multi option mounting bracket component 200 includes four foot projections 240. In certain embodiments, the one or more foot projections 240 each include respective surface mounting apertures 242 and VESA mounting apertures 244.

In certain embodiments, the multi mount option mounting bracket component 200 defines one or more rail standard mounting visibility apertures 260. In certain embodiments, the multi mount option mounting bracket component 200 defines one or more rail standard mounting clip apertures 262. In certain embodiments, a pair of rail standard mounting clip fastener apertures is associated with a respective rail standard mounting visibility aperture 260. In certain embodiments, the one or more rail standard mounting visibility apertures 260 are configured to mate with respective rail standard mounting clips. In certain embodiments, the one or more rail standard mounting fastener apertures 262 are used to attach respective rail standard mounting clips to the multi mount option mounting bracket component 200.

FIGS. 3A, 3B, 3C, 3D, 3E and 3F, generally referred to as FIG. 3, respectively show top bottom, left, right, front and rear, views of a multi mount option side panel mounting component 300. FIG. 3G, generally referred to as FIG. 3, shows a top perspective view of a multi mount option side panel mounting component 300. FIG. 3H, generally referred to as FIG. 3, shows a bottom perspective view of a multi mount option side panel mounting component 300. In certain embodiments, the multi mount option side panel mounting component 300 interacts with a multi mount bracket and a multi mount optimized information handling system chassis to perform a multi mount option mounting operation. In certain embodiments, the side panel mounting component is attached to the server chassis in a first attachment configuration or a second attachment configuration.

In certain embodiments, the multi mount option side panel mounting component 300 includes a bracket attachment portion 310, a chassis latch portion 312, or a combination thereof. In certain embodiments, the multi mount option side panel mounting component defines a side panel locking aperture portion 316.

In certain embodiments when in a first attachment configuration, the bracket attachment portion 310 interacts with a multi mount bracket to secure an information handling system to the multi mount bracket. In certain embodiments, the bracket attachment portion 310 includes a substantially U shaped portion which mates with a respective server mounting slot of a multi mount bracket. In certain embodiments, the bracket attachment portion 310 mates with one of a right side server mounting slot and a left side server mounting slot.

In certain embodiments when in a second attachment configuration, the bracket attachment portion 310 interacts with a server chassis to secure an information handling system to the multi mount bracket. In certain embodiments, the bracket attachment portion 310 includes a substantially U shaped portion which mates with a respective side portion of a server chassis to attach the side panel mounting component 300 to the server chassis.

In certain embodiments, the chassis latch portion 312 includes a chassis connection portion 320, a side panel mounting component release button 324, a side panel mounting component release lever, or a combination thereof.

In certain embodiments, the side panel locking aperture 316 includes a first side panel locking aperture 330 and a second side panel locking aperture 332. In certain embodiments, one of the first side panel locking aperture 330 and the second side panel locking aperture 332 interact with a server lock portion. In certain embodiments, one of the first side panel locking aperture 330 and the second side panel locking aperture 332 interact with a server lock portion depending on when the side panel mounting component is attached to the server chassis in a first attachment configuration or a second attachment configuration.

Figure 4A:
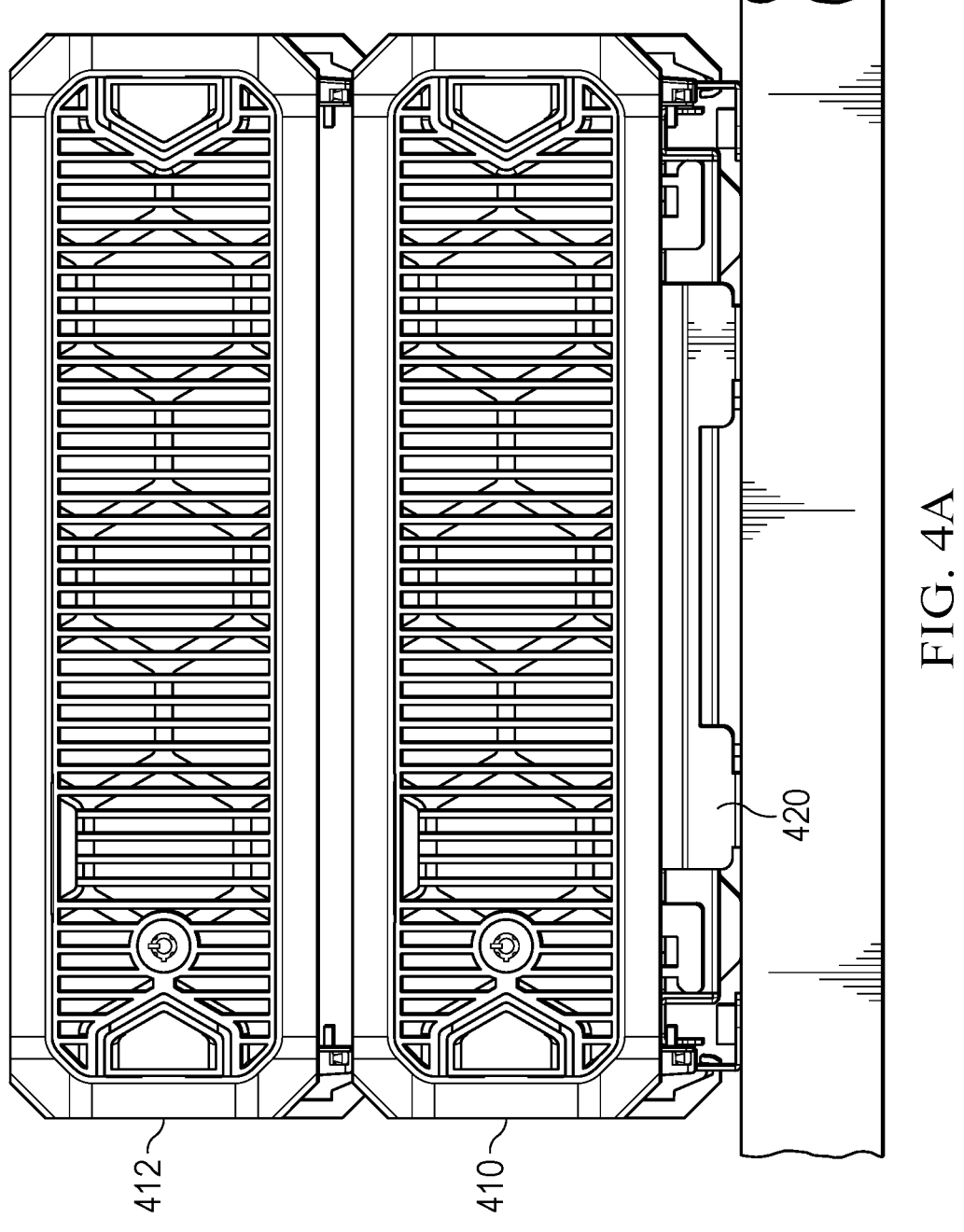
FIGS. 4A and 4B, generally referred to as FIG. 4, respectively show front and side views of an information handling system table mount mounting option in accordance with the present disclosure.
Figure 4B:
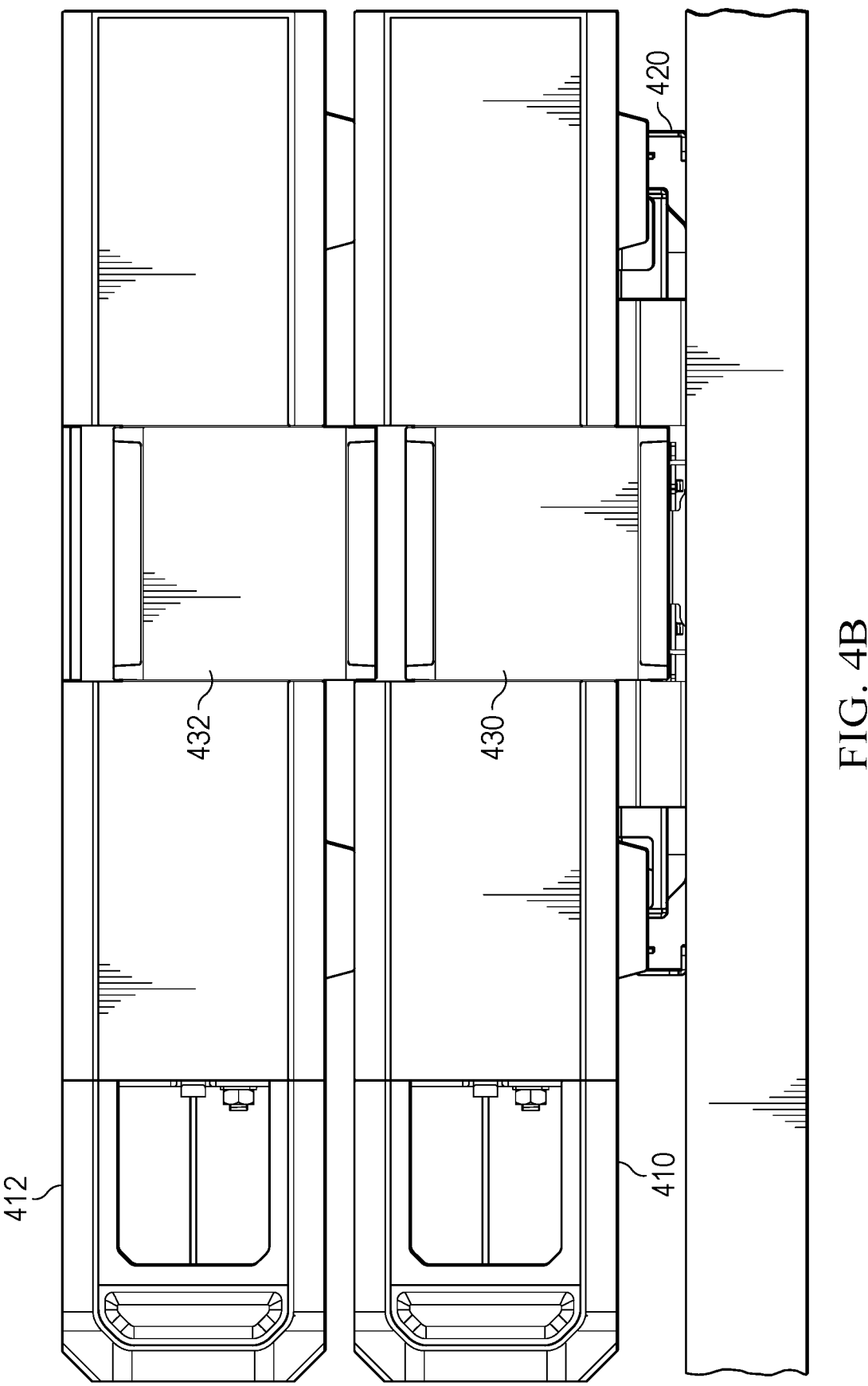

FIGS. 4A and 4B, generally referred to as FIG. 4, respectively show front and side views of an information handling system table mount mounting option in accordance with the present disclosure. More specifically, one or more information handling systems 410, 412 are mounted to an upwardly facing flat surface such as a table using multi mount option mounting system. In certain embodiments, a first information handling system 410 is physically attached to a multi mount option mounting component 420 which is in turn physically attached to a flat surface such as a table. In certain embodiments, first side panels 430 are used to attach the first information handling system 410 to the multi mount option mounting component 420. In certain embodiments, second side panels 432 are used to attach a second information handling system 412 to the first information handling system 410.

Figure 4C:
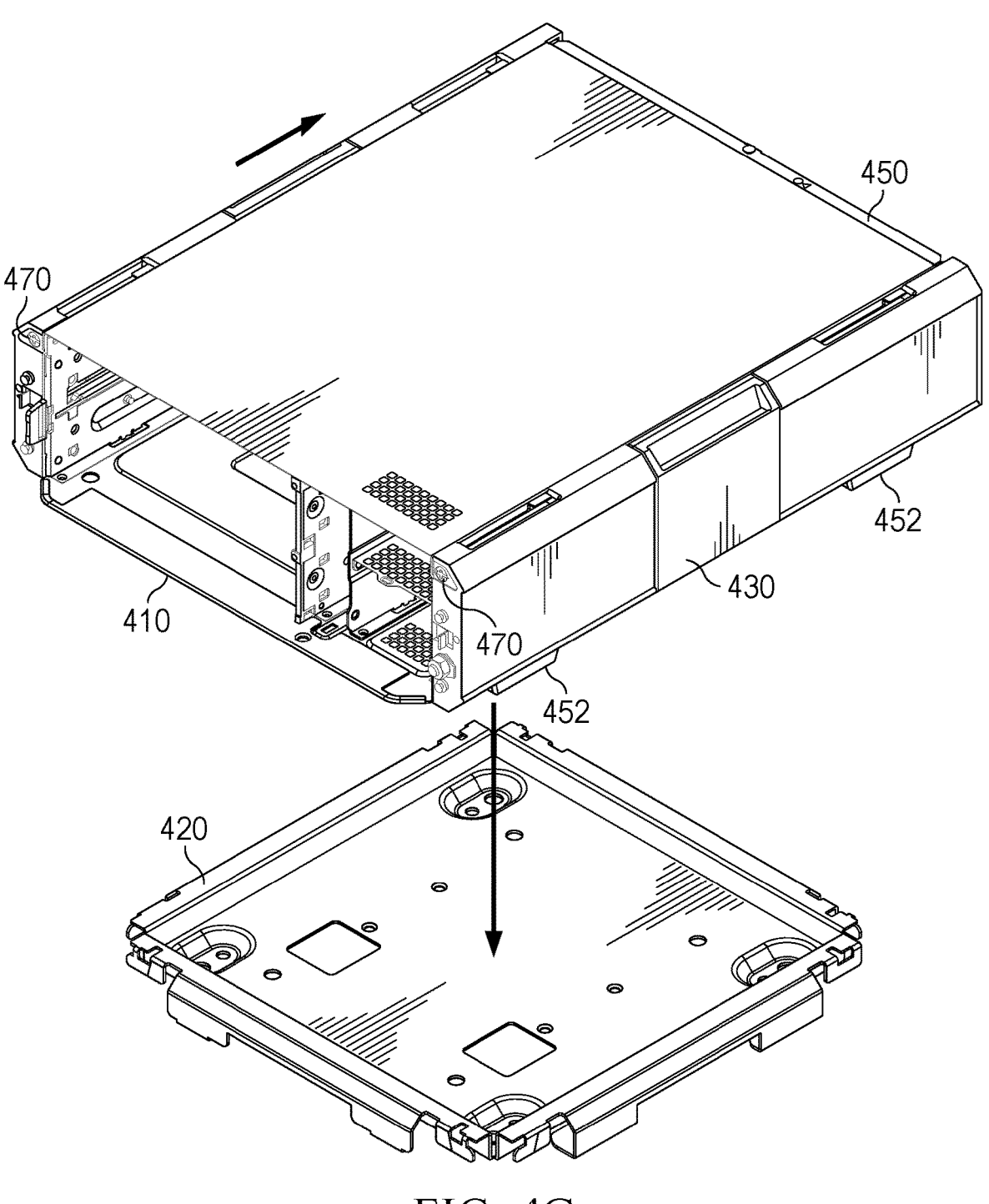
FIGS. 4C and 4D, generally referred to as FIG. 4, show a plurality of stages of an information handling system table mount mounting operation in accordance with the present disclosure.
Figure 4D:
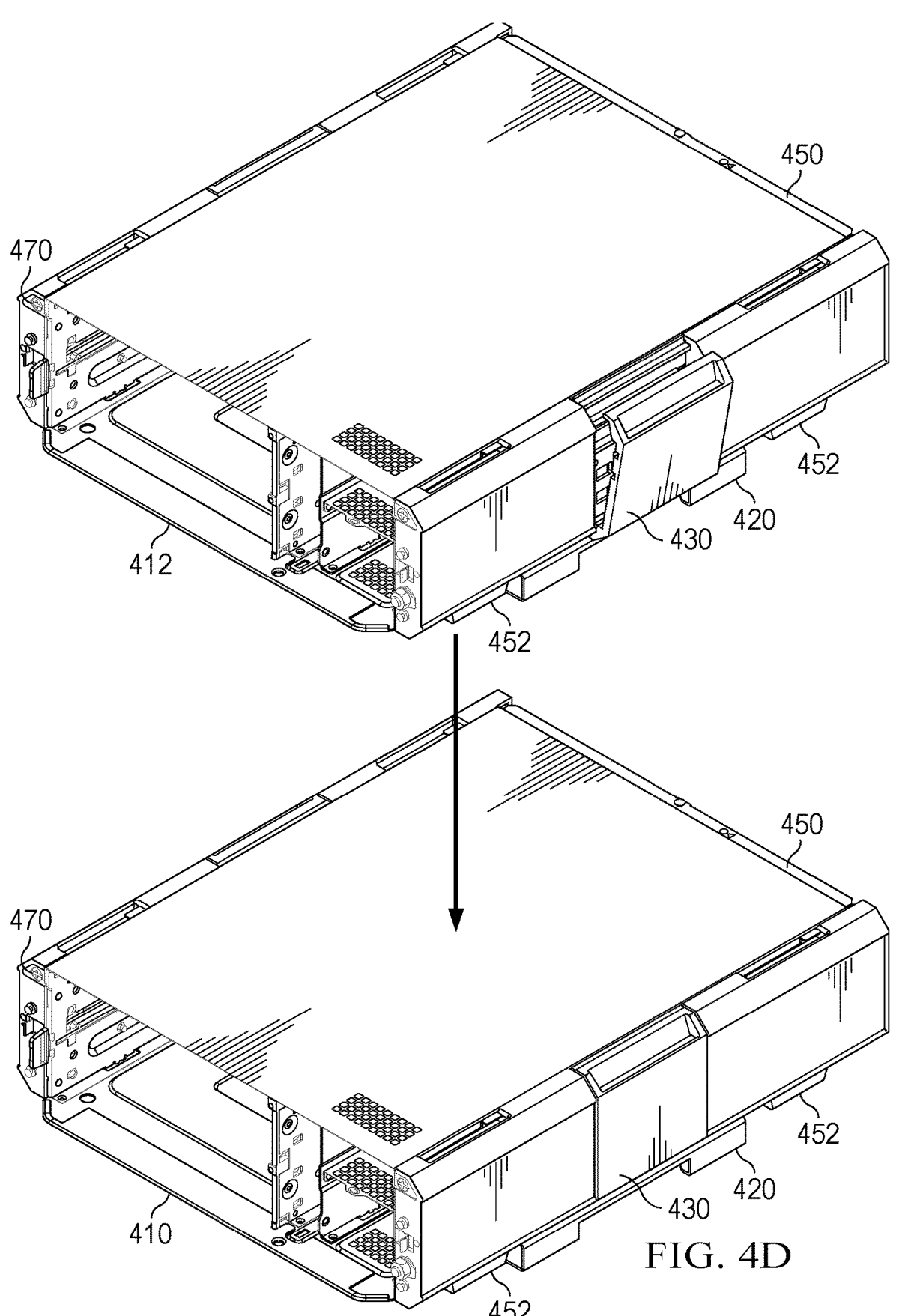

FIGS. 4C and 4D, generally referred to as FIG. 4, show a plurality of stages of an information handling system table mount mounting operation. As used herein, an information handling system table mount mounting operation broadly refers to any task, function, procedure, or process performed, directly or indirectly to mount an information handling system to an upwardly facing horizontal flat surface such as a table using a multi mount option mounting system.

In certain embodiments, the information handling system chassis 450 includes pre-alignment features 452 which are used to align the information handling system chassis 450 with the multi mount option mounting component 420 as the information handling system chassis 450 is vertically inserted into the multi mount option mounting component 420 and then slid horizontally rearwardly to complete the attachment of the information handling system chassis to the multi mount option mounting component 450. Next, right and left side panel latches are inwardly rotated to cause a side panel latch to engage with cutouts on the chassis 450. After the side panel latches are engaged, respective locking buttons 470 are rotated to lock respective side panel latches 460 in place.

Figure 5A:
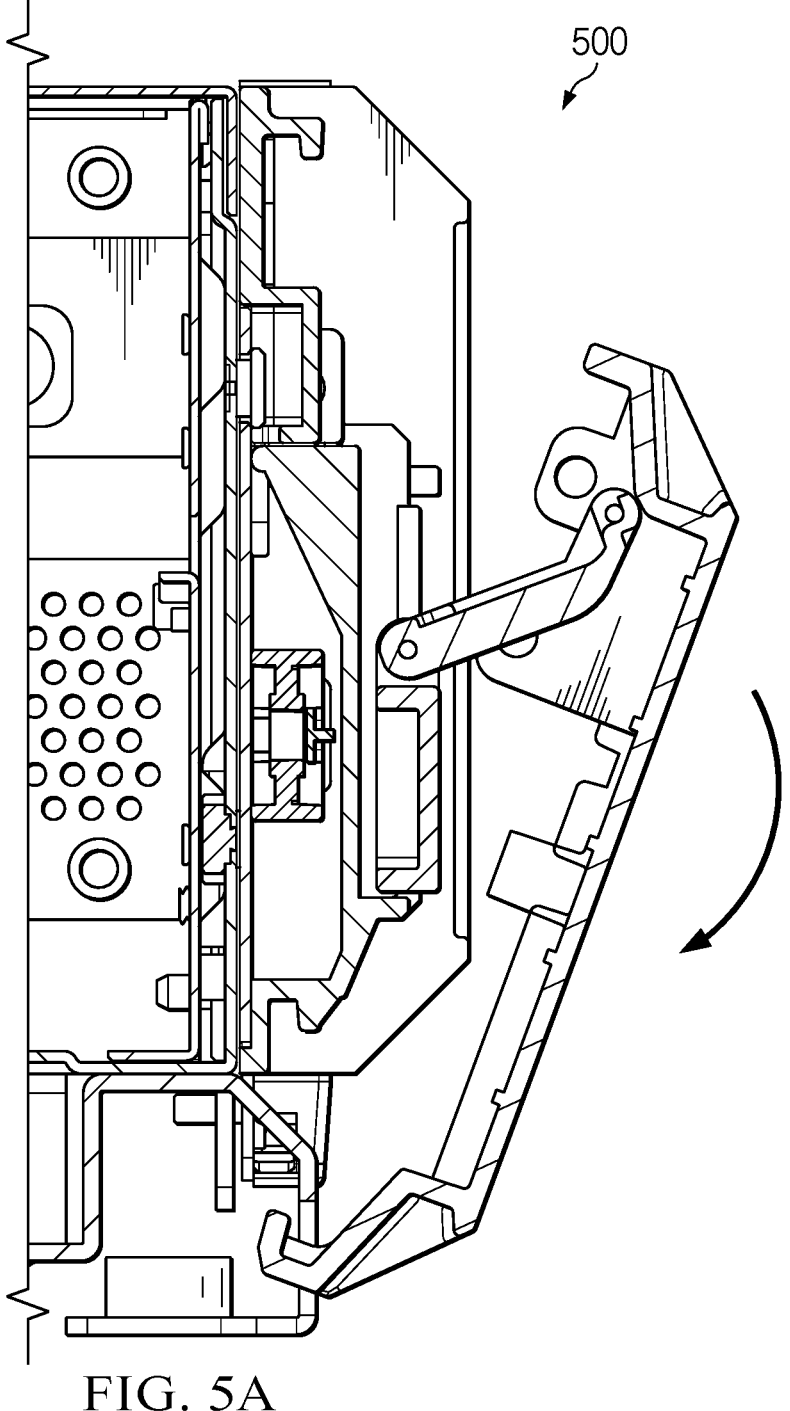
FIGS. 5A and 5B, generally referred to as FIG. 5, show side views of the operation of a side panel mounting component when operating in a first attachment configuration in accordance with the present disclosure.
Figure 5B:
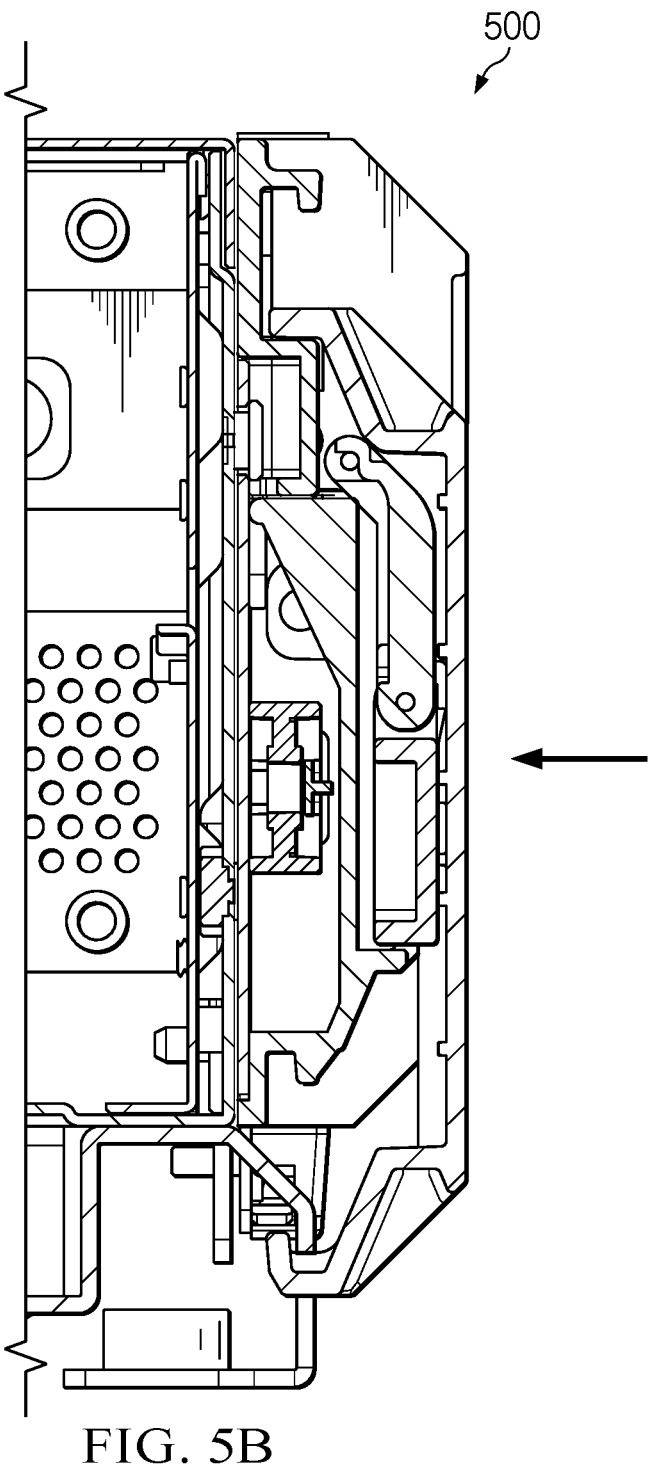
Figure 5C:
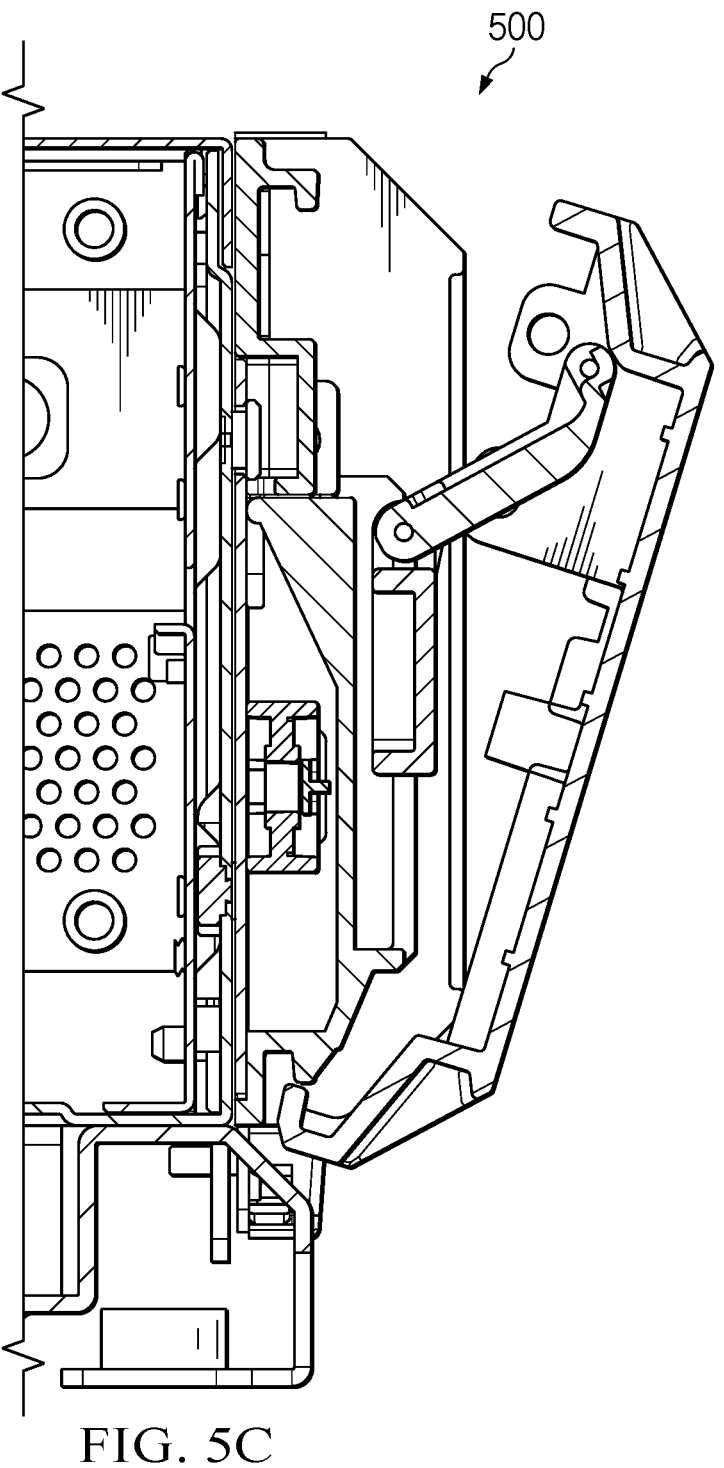
FIGS. 5C and 5D, generally referred to as FIG. 5, show side views of the operation of a side panel mounting component when operating in a second attachment configuration in accordance with the present disclosure.
Figure 5D:
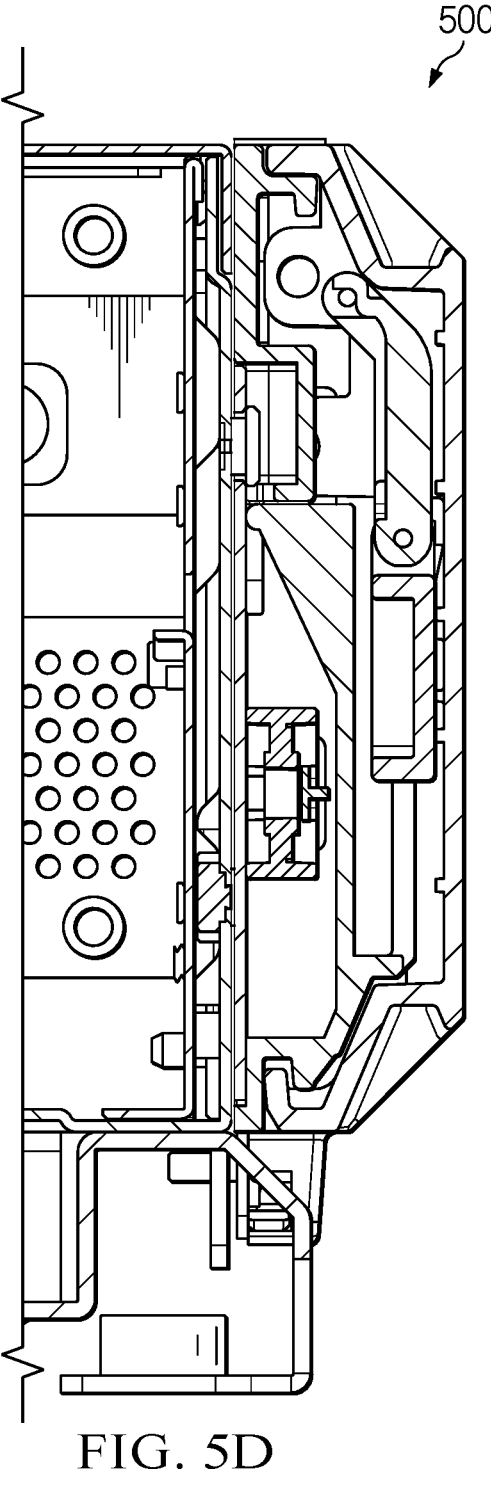

FIGS. 5A and 5B, generally referred to as FIG. 5, show side views of the operation of a side panel mounting component when operating in a first attachment configuration. FIGS. 5C and 5D, generally referred to as FIG. 5, show side views of the operation of a side panel mounting component when operating in a second attachment configuration. In certain embodiments, the side panel mounting component is attached to the server chassis in a first attachment configuration or a second attachment configuration.

More specifically, when operating in a first attachment configuration, the side panel mounting component 500 is inwardly rotated to cause the side panel mounting component to engage with cutouts on a multi mount option mounting component. After the latch of the side panel mounting component 500 is engaged, a locking button may be rotated to lock the side panel mounting component 500 in place.

More specifically, when operating in the second attachment configuration, the side panel mounting component 500 is inwardly rotated to cause the side panel mounting component to engage with cutouts on the chassis. After the latch of the side panel mounting component 500 is engaged, a locking button may be rotated to lock the side panel mounting component 500 in place.

Figure 6A:
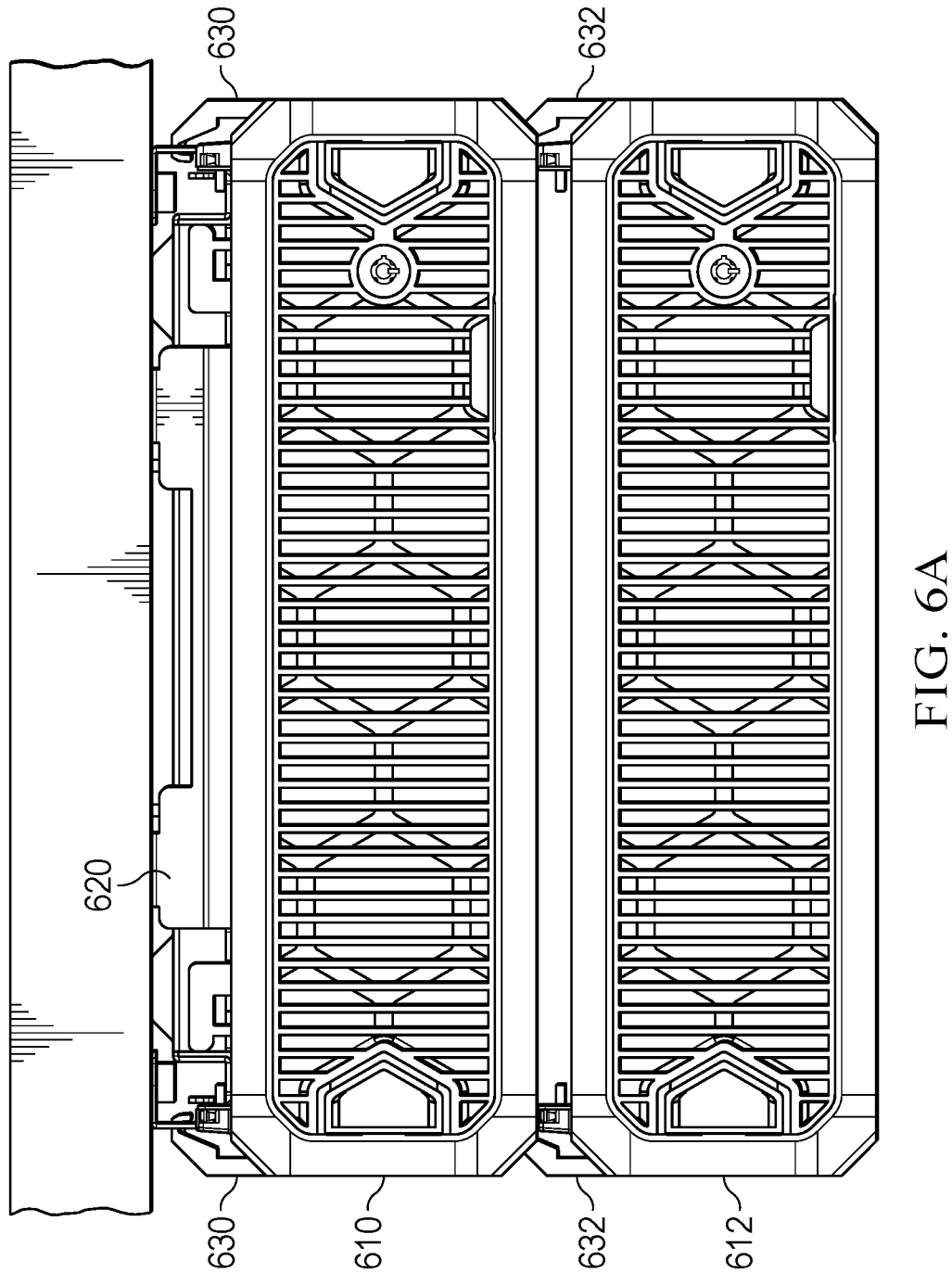
FIGS. 6A, 6B and 6C, generally referred to as FIG. 6, respectively show front, rear and side views of an information handling system ceiling mount mounting option in accordance with the present disclosure.
Figure 6B:
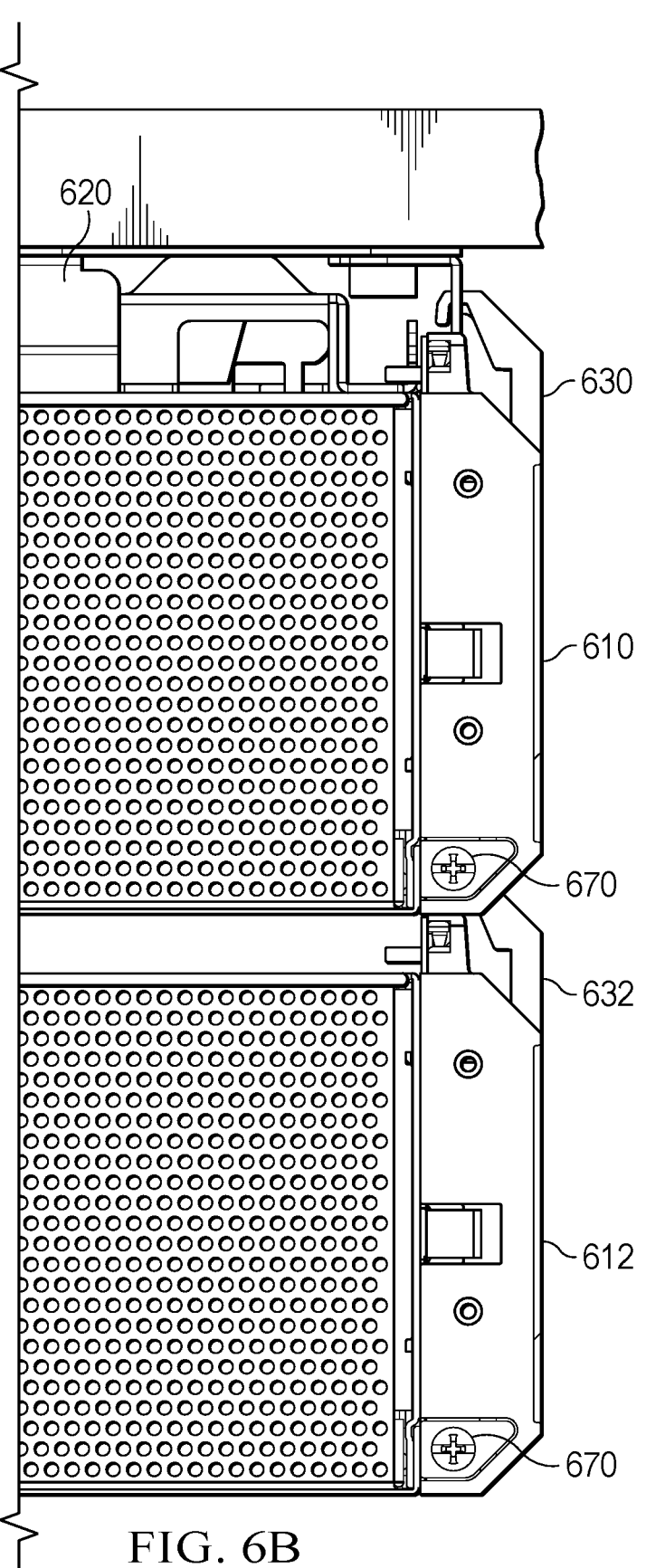
Figure 6C:
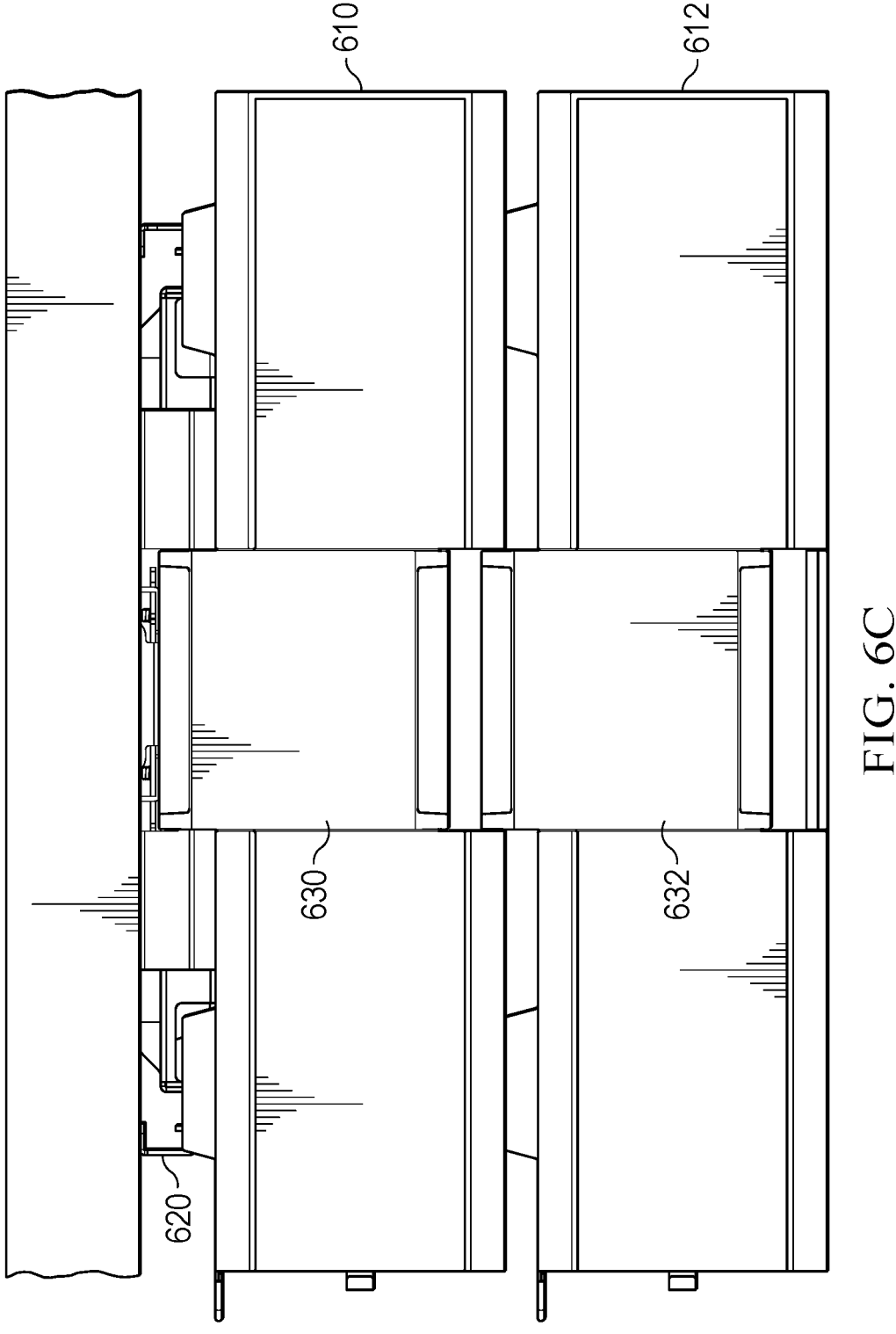

FIGS. 6A, 6B and 6C, generally referred to as FIG. 6, respectively show front, rear and side views of an information handling system ceiling mount mounting option. More specifically, one or more information handling systems 610, 612 are mounted to a downwardly facing flat surface such as a ceiling using multi mount option mounting system. In certain embodiments, a first information handling system 610 is physically attached to a multi mount option mounting component 620 which is in turn physically attached to the downwardly facing flat surface. In certain embodiments, first side panels 630 are used to attach the first information handling system 610 to the multi mount option mounting component 620. In certain embodiments, second side panels 632 are used to attach a second information handling system 612 to the first information handling system 610.

Figure 6D:
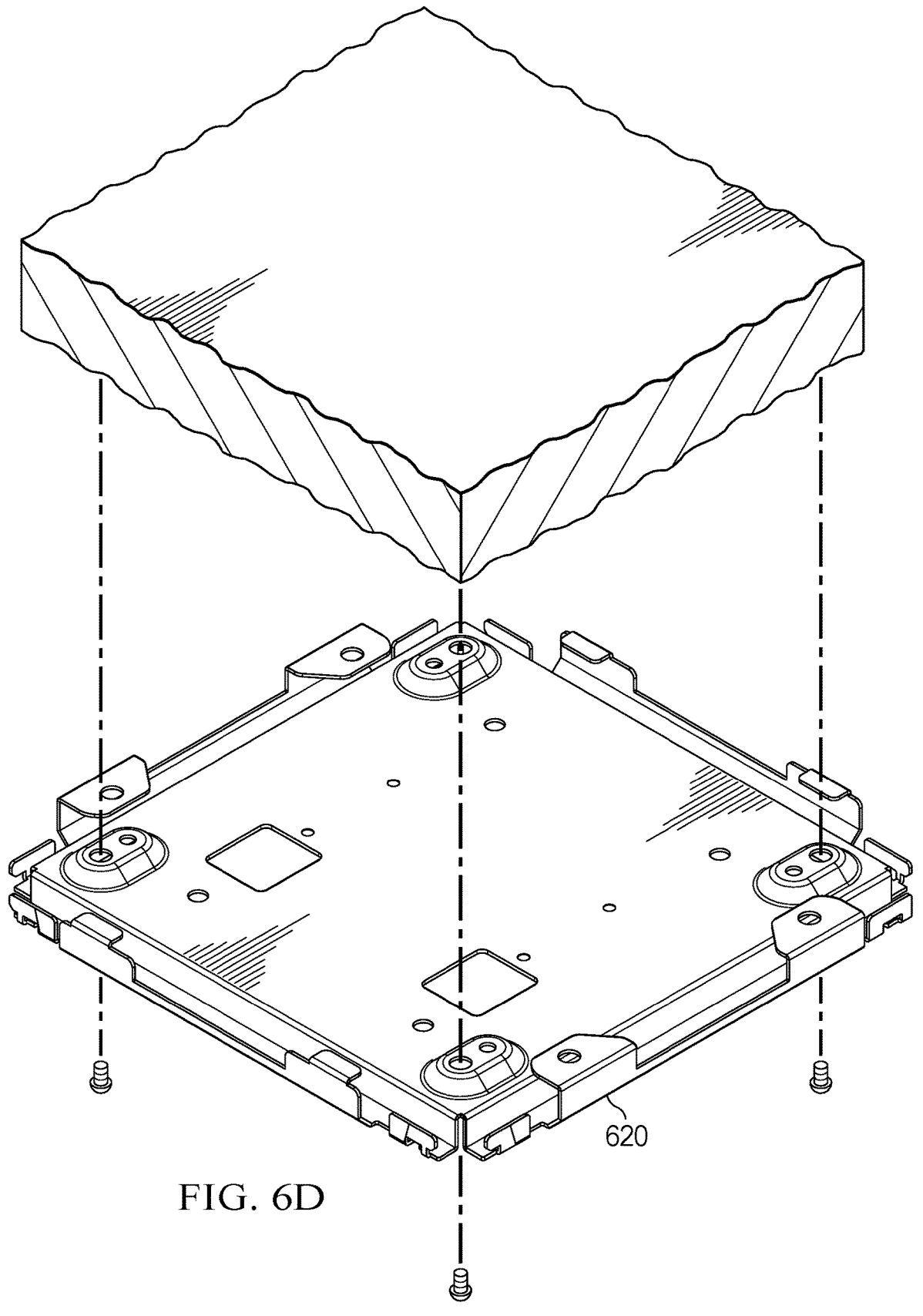
FIGS. 6D and 6E, generally referred to as FIG. 6, show a plurality of stages of an information handling system ceiling mount mounting operation in accordance with the present disclosure.
Figure 6E:
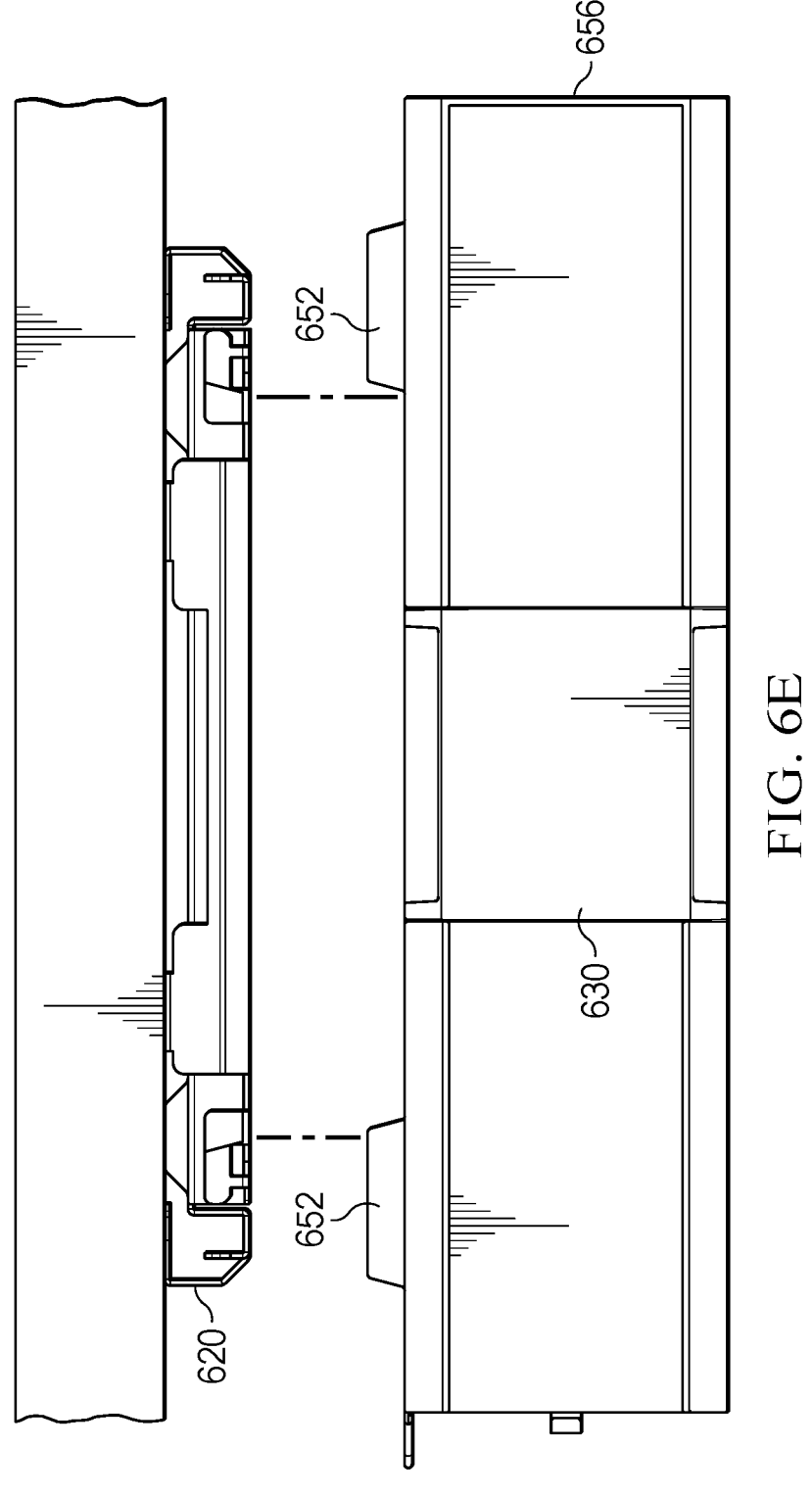

FIGS. 6D and 6E, generally referred to as FIG. 6, show a plurality of stages of an information handling system ceiling mount mounting operation. As used herein, an information handling system ceiling mount mounting operation broadly refers to any task, function, procedure, or process performed, directly or indirectly to mount an information handling system to a downwardly facing horizontal flat surface such as a ceiling using a multi mount option mounting system.

In certain embodiments, the information handling system chassis 650 includes pre-alignment features 652 which are used to align the information handling system chassis 640 with the multi mount option mounting component 620 as the information handling system chassis 650 is vertically inserted into the multi mount option mounting component 620 and then slid horizontally rearwardly to complete the attachment of the information handling system chassis to the multi mount option mounting component 650. Next, right and left side panel latches are inwardly rotated to cause a side panel latch to engage with cutouts on the multi mount option mounting component 650. After the side panel latches are engaged, respective locking buttons are rotated to lock respective side panel latches in place.

Figure 7A:
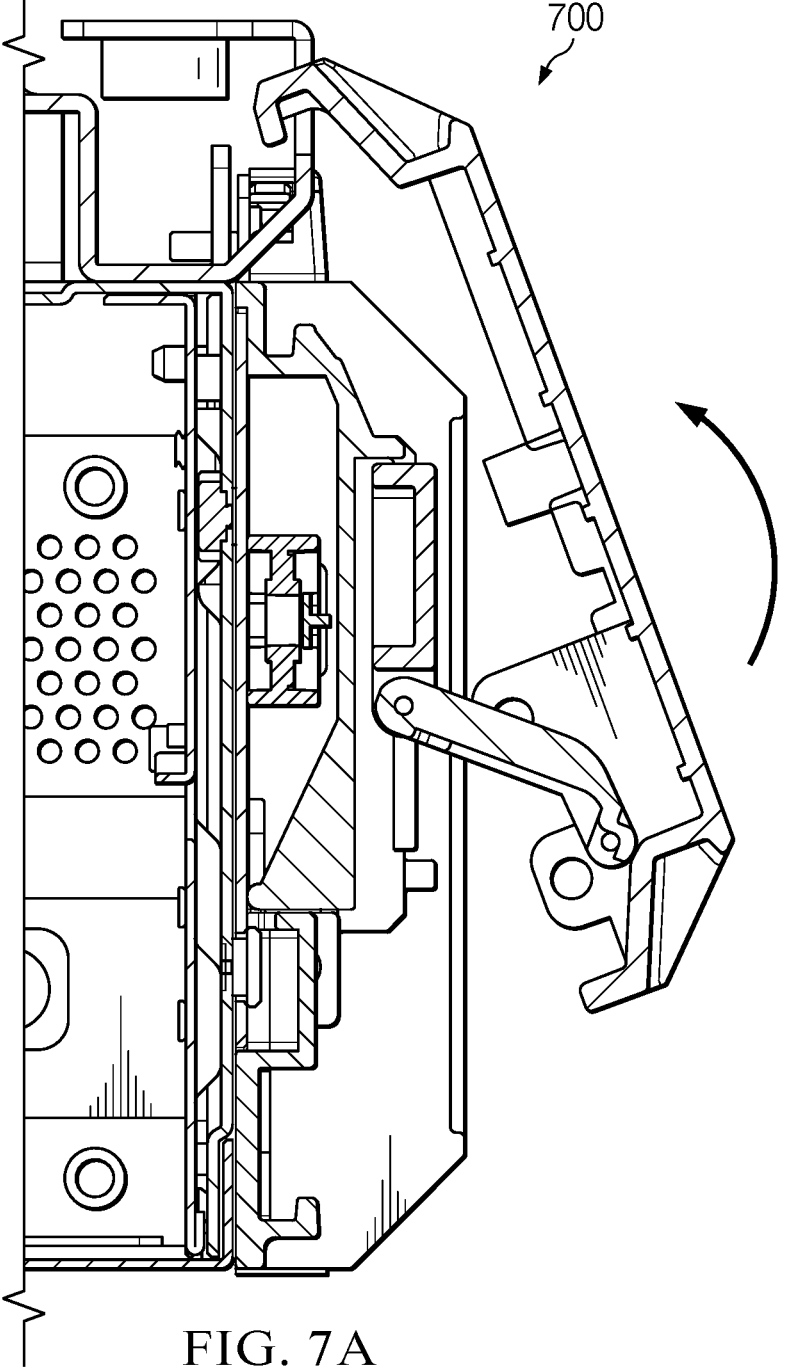
FIGS. 7A and 7B, generally referred to as FIG. 7, shows side views of the operation of a side panel mounting component in accordance with the present disclosure.
Figure 7B:
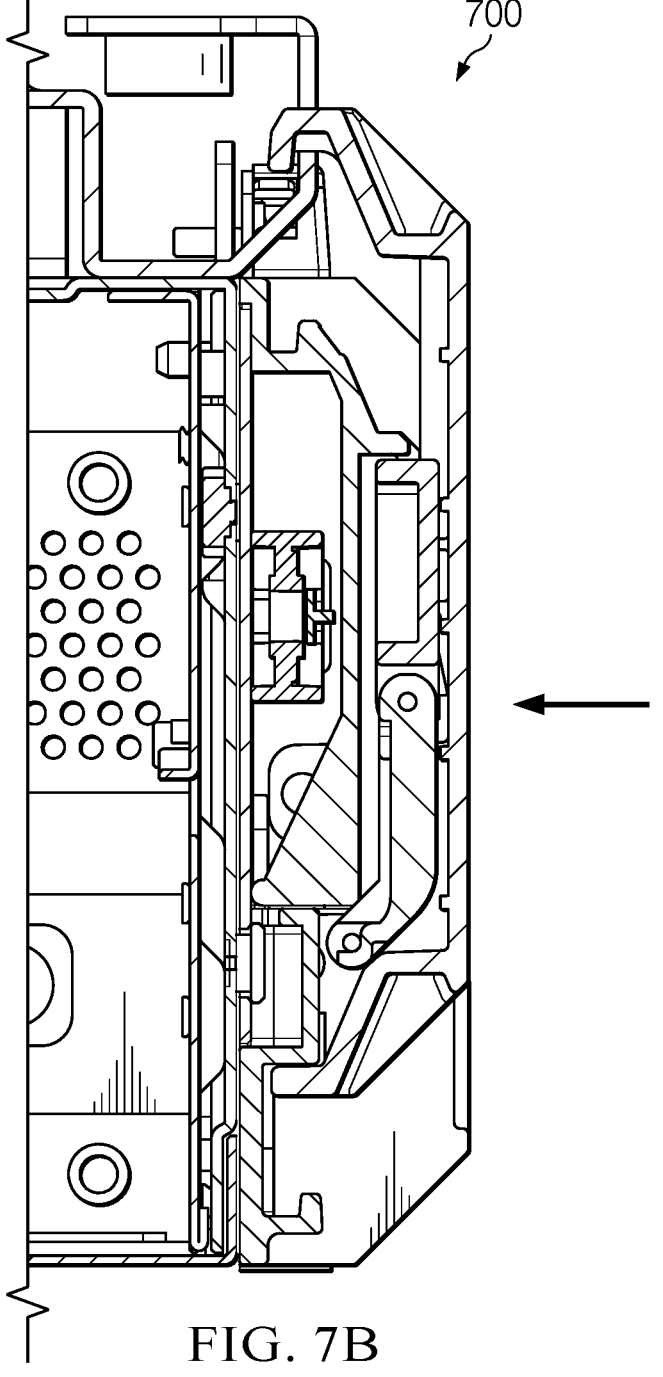

FIGS. 7A and 7B, generally referred to as FIG. 7, shows side views of the operation of a side panel mounting component 700. More specifically, the side panel mounting component 700 is inwardly rotated to cause the side panel mounting component to engage with cutouts on a multi mount option mounting component. After the latch of the side panel mounting component 700 is engaged, a locking button may be rotated to lock the side panel mounting component 700 in place.

Figure 8A:
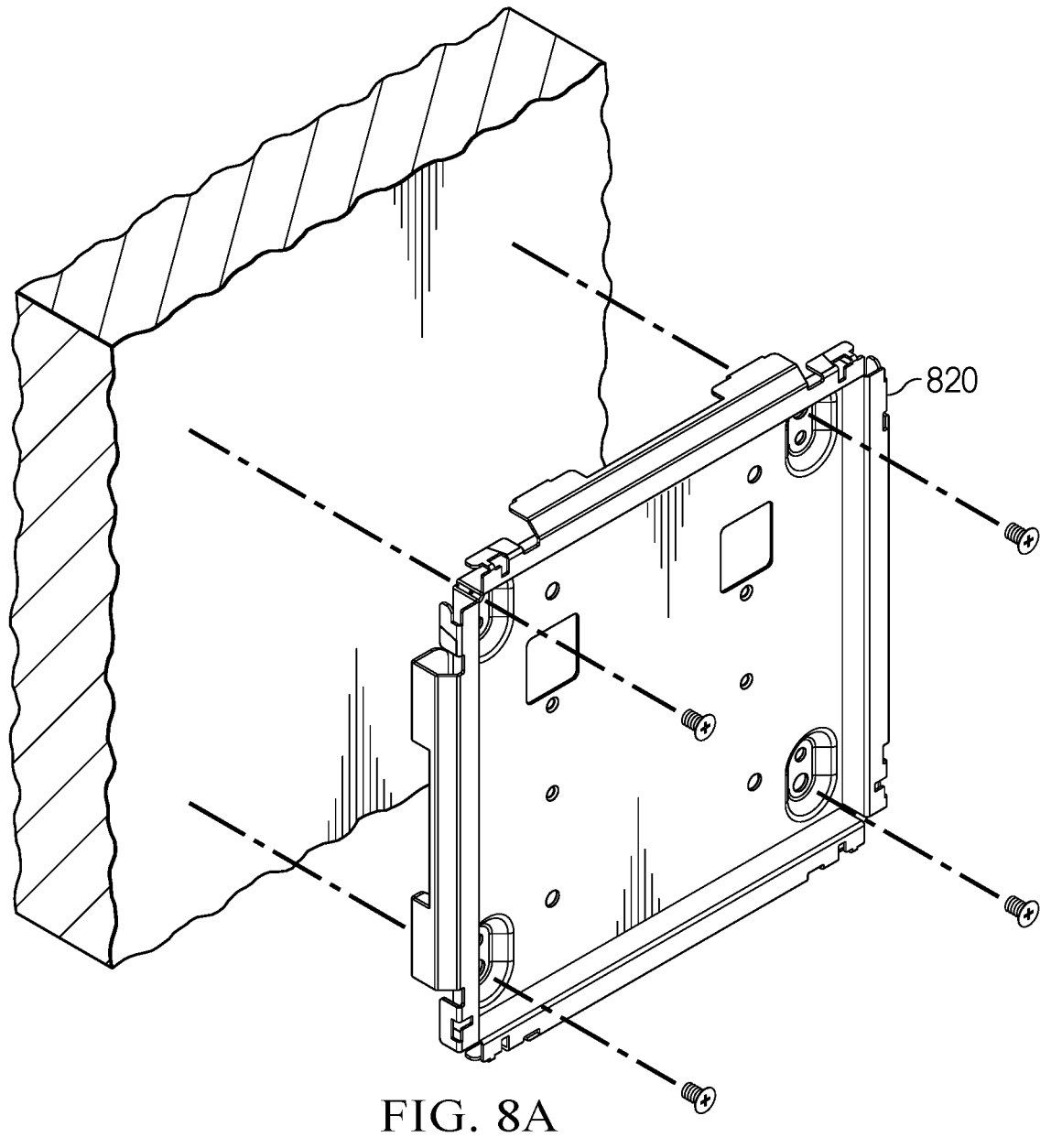
FIGS. 8A and 8B, generally referred to as FIG. 8, show a plurality of stages of an information handling system wall mount mounting operation in accordance with the present disclosure.
Figure 8B:
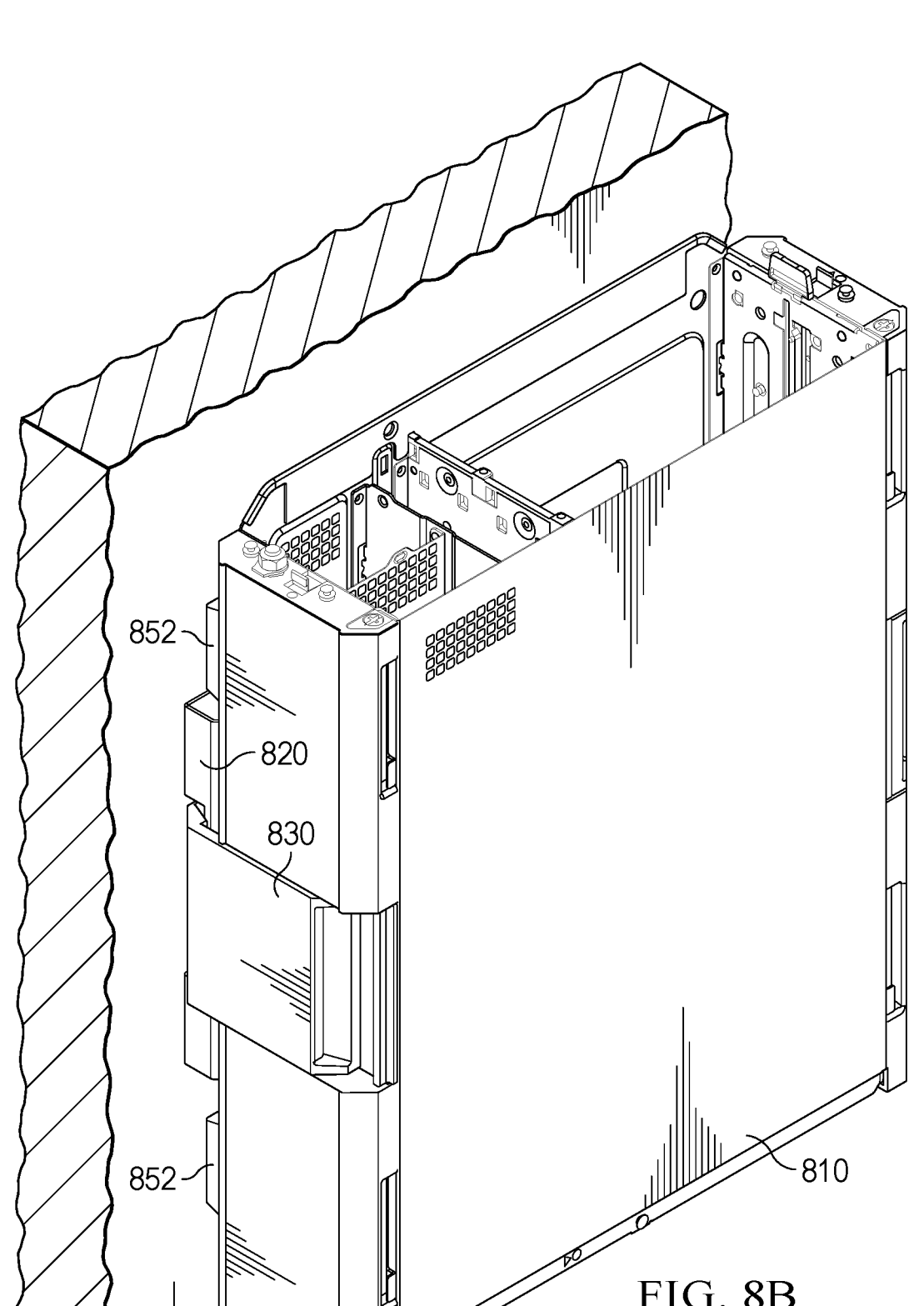

FIGS. 8A and 8B, generally referred to as FIG. 8, show a plurality of stages of an information handling system wall mount mounting operation in accordance with the present disclosure. More specifically, an information handling system 810 is mounted to a sideward facing flat surface such as a wall using multi mount option mounting system. As used herein, an information handling system wall mount mounting operation broadly refers to any task, function, procedure, or process performed, directly or indirectly to mount an information handling system to a sideward facing horizontal flat surface such as a wall using a multi mount option mounting system. In certain embodiments, the information handling system 810 is physically attached to a multi mount option mounting component 820 which is in turn physically attached to the sideward facing flat surface. In certain embodiments, side panels 830 are used to attach the information handling system 810 to the multi mount option mounting component 820.

In certain embodiments, the information handling system chassis 850 includes pre-alignment features 852 which are used to align the information handling system chassis 840 with the multi mount option mounting component 820 as the information handling system chassis 850 is vertically inserted into the multi mount option mounting component 820 and then slid horizontally rearwardly to complete the attachment of the information handling system chassis to the multi mount option mounting component 850. Next, right and left side panel latches 860 are inwardly rotated to cause a side panel latch to engage with cutouts on the multi mount option mounting component 850. After the side panel latches 860 are engaged, respective locking buttons are rotated to lock respective side panel latches 860 in place.

Figure 9A:
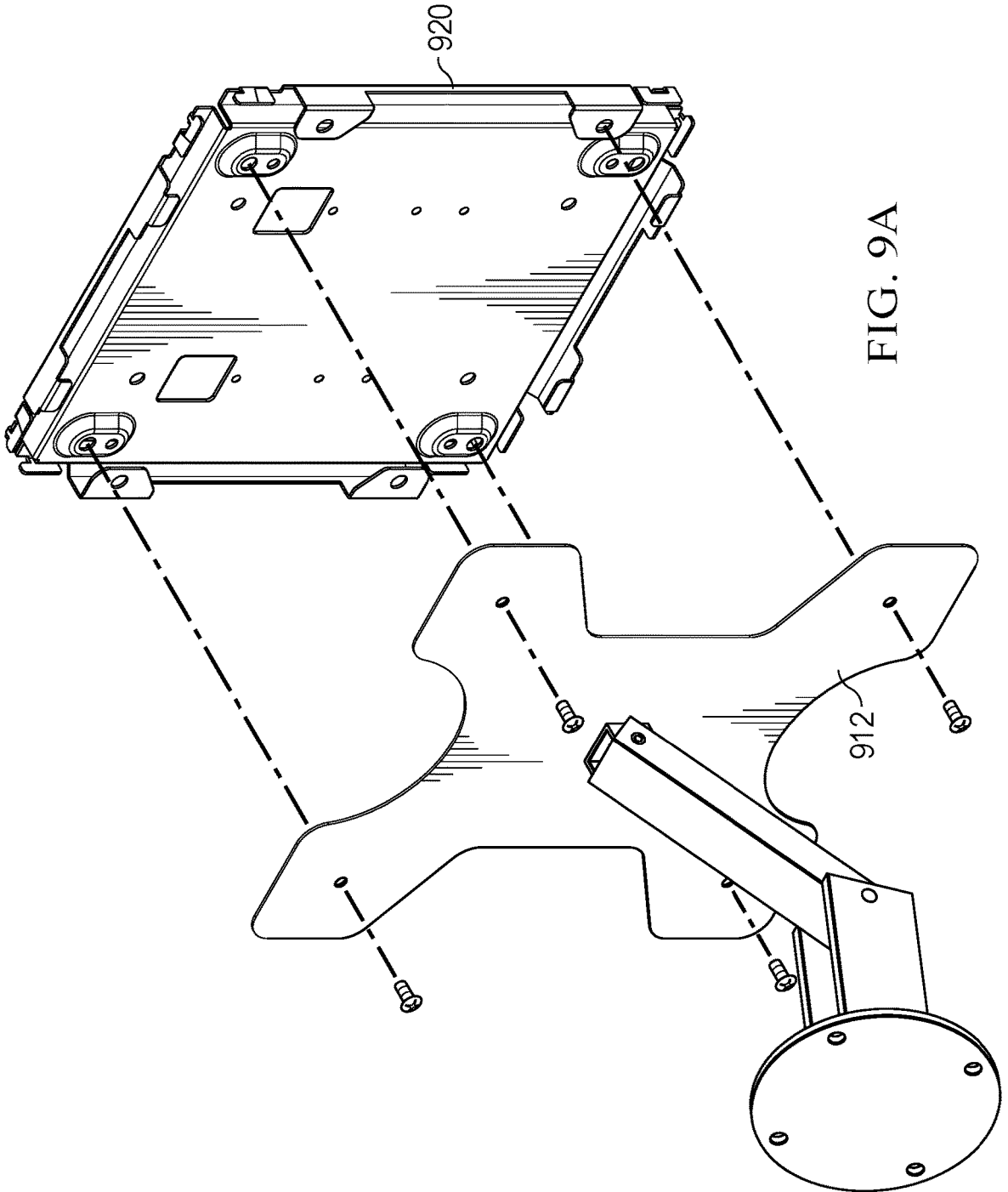
FIGS. 9A and 9B, generally referred to as FIG. 9, show a plurality of stages of an information handling system display mounting standard mounting operation in accordance with the present disclosure.
Figure 9B:
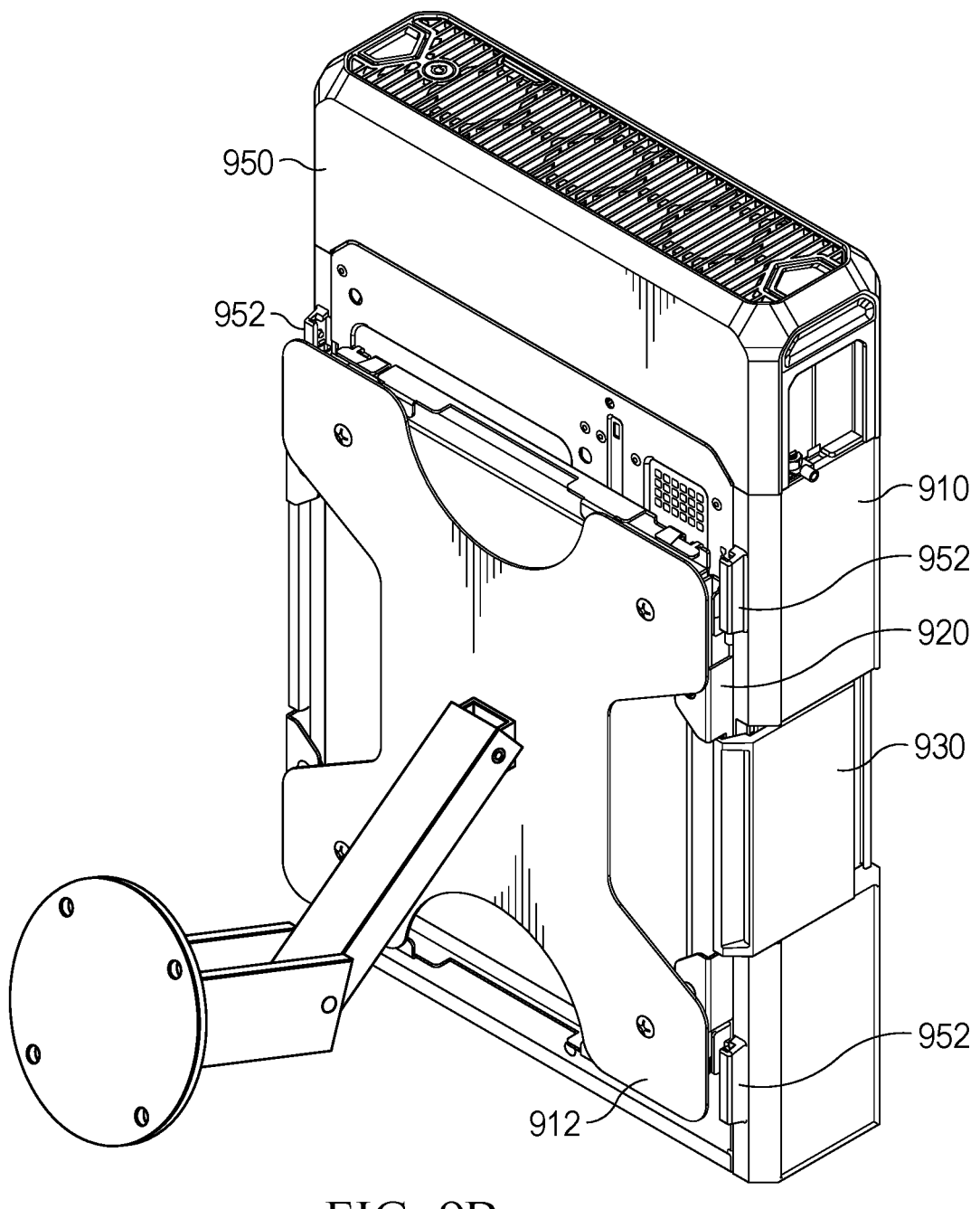

FIGS. 9A and 9B, generally referred to as FIG. 9, show a plurality of stages of an information handling system display mounting standard mounting operation. More specifically, an information handling system 910 is mounted to a display mount bracket 912. In certain embodiments, the display mount bracket 912 conforms to a VESA mounting standard. As used herein, an information handling system display mounting standard mounting operation broadly refers to any task, function, procedure, or process performed, directly or indirectly to mount an information handling system to a display mount bracket using a multi mount option mounting system. In certain embodiments, the information handling system 910 is physically attached to a multi mount option mounting component 920 which is in turn physically attached to the display mount bracket 912. In certain embodiments, side panels 930 are used to attach the information handling system 910 to the multi mount option mounting component 920.

In certain embodiments, the information handling system chassis 950 includes pre-alignment features 952 which are used to align the information handling system chassis 940 with the multi mount option mounting component 920 as the information handling system chassis 950 is attached to the multi mount option mounting component 920. Next, right and left side panel latches are inwardly rotated to cause a side panel latch to engage with cutouts on the multi mount option mounting component 950.

Figure 10A:
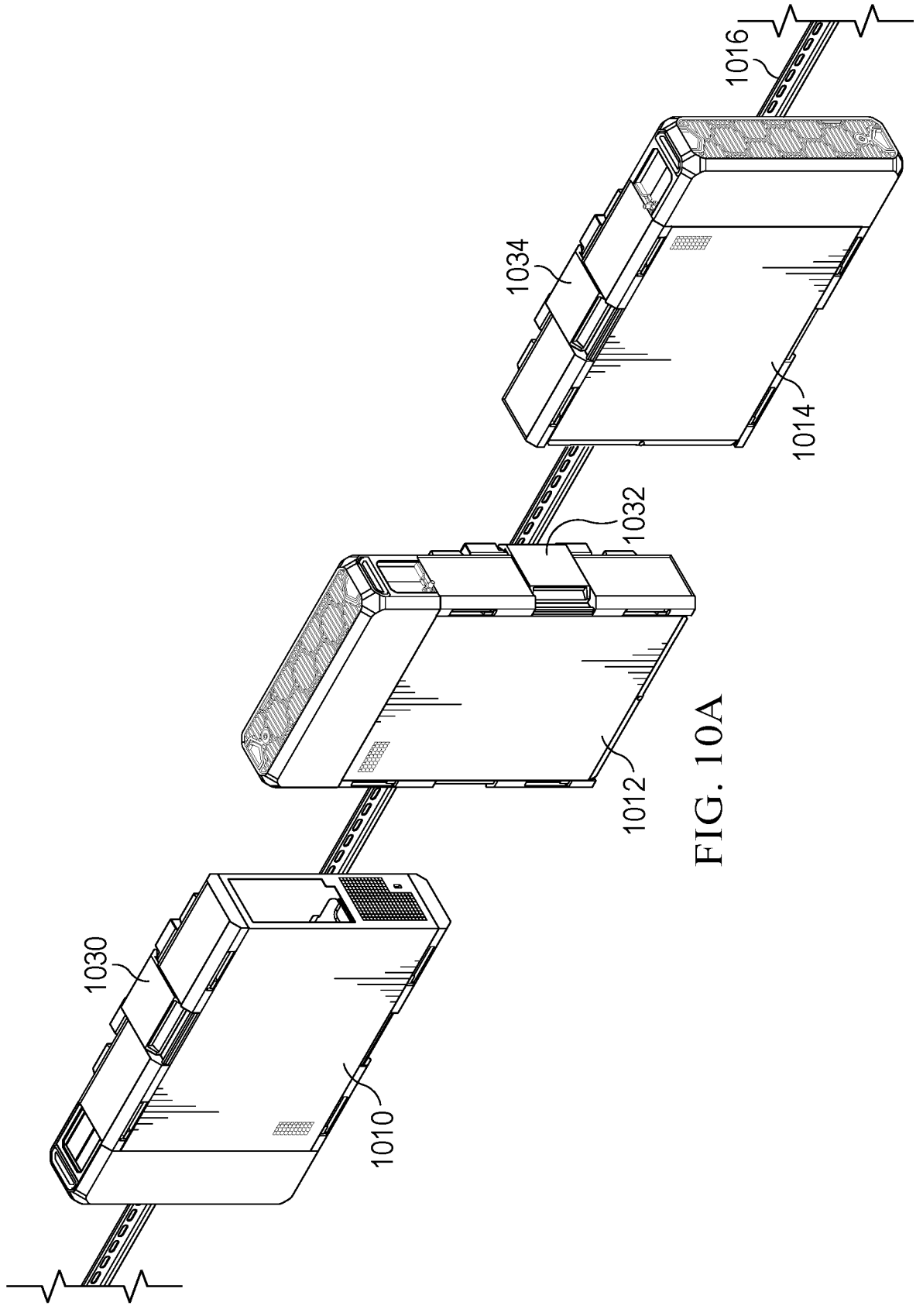
FIG. 10A, generally referred to as FIG. 10, shows a perspective view of a rail mounting standard mounting operation.

FIG. 10A, generally referred to as FIG. 10, shows a perspective view of a rail mounting standard mounting operation. More specifically, one or more information handling systems 1010, 1012, 1014 are mounted to a rail mounting standard mounting rail 1016 using multi mount option mounting system. In certain embodiments, the information handling systems may be mounted in a horizontal orientation (see e.g., 1010, 1014) a vertical orientation (see e.g., 1012), or a combination thereof. In certain embodiments, a first information handling system 1010 is physically attached to a multi mount option mounting component 1020 which is in turn physically attached to the rail mounting standard mounting rail 1016. In certain embodiments, first side panels 1030 are used to attach the first information handling system 1010 to the multi mount option mounting component 1020. In certain embodiments, a second information handling system 1012 is physically attached to a respective multi mount option mounting component 1020 which is in turn physically attached to the rail mounting standard mounting rail 1016. In certain embodiments, second side panels 1032 are used to attach the second information handling system 1012 to the multi mount option mounting component 1020. In certain embodiments, a third information handling system 1014 is physically attached to a respective multi mount option mounting component 1020 which is in turn physically attached to the rail mounting standard mounting rail 1016. In certain embodiments, third side panels 1034 are used to attach the third information handling system 1014 to the multi mount option mounting component 1020.

Figure 10B:
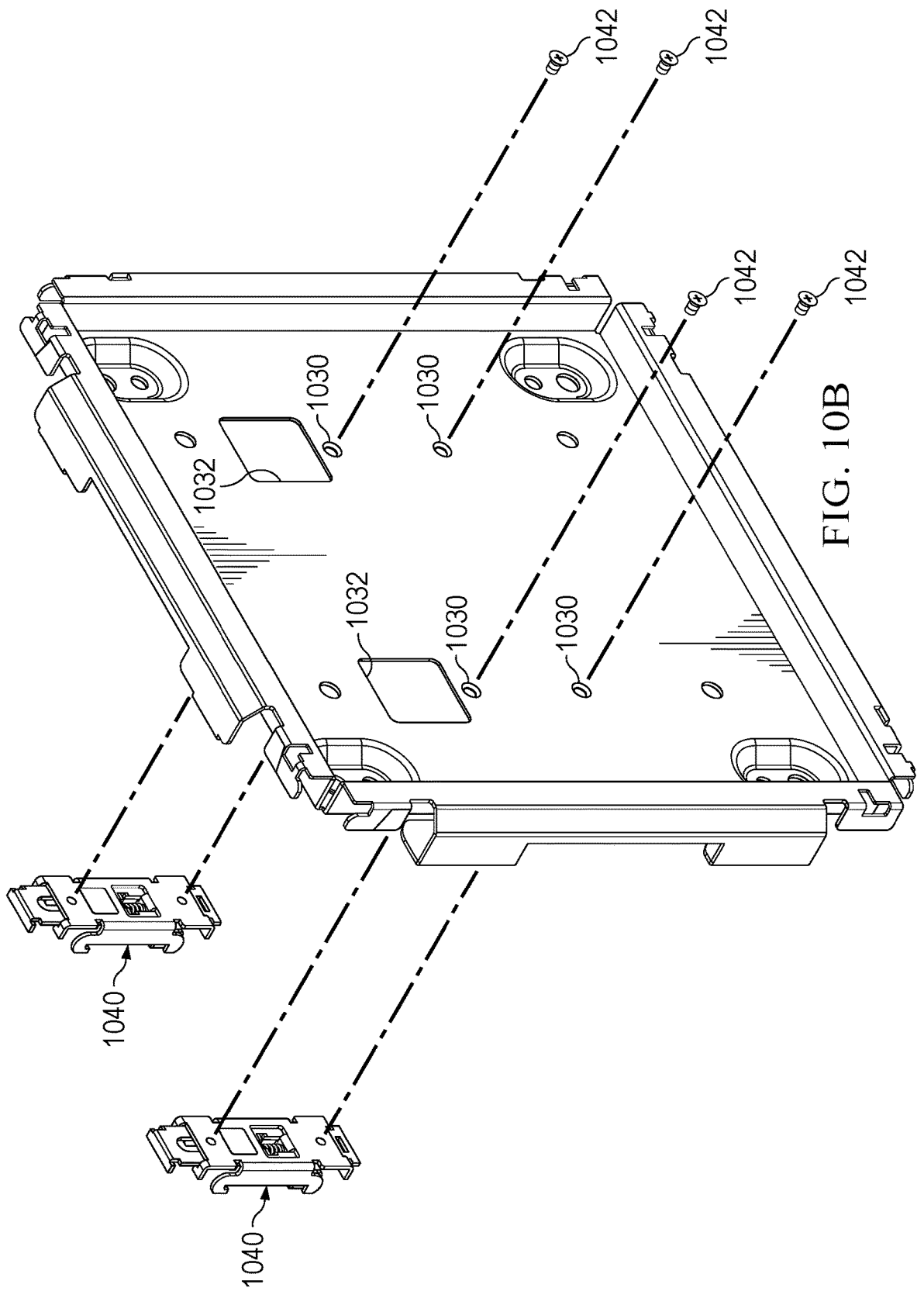
FIGS. 10B and 10C, generally referred to as FIG. 10, show perspective views of multi mount option mounting component when performing a rail mounting standard mounting operation.
Figure 10C:
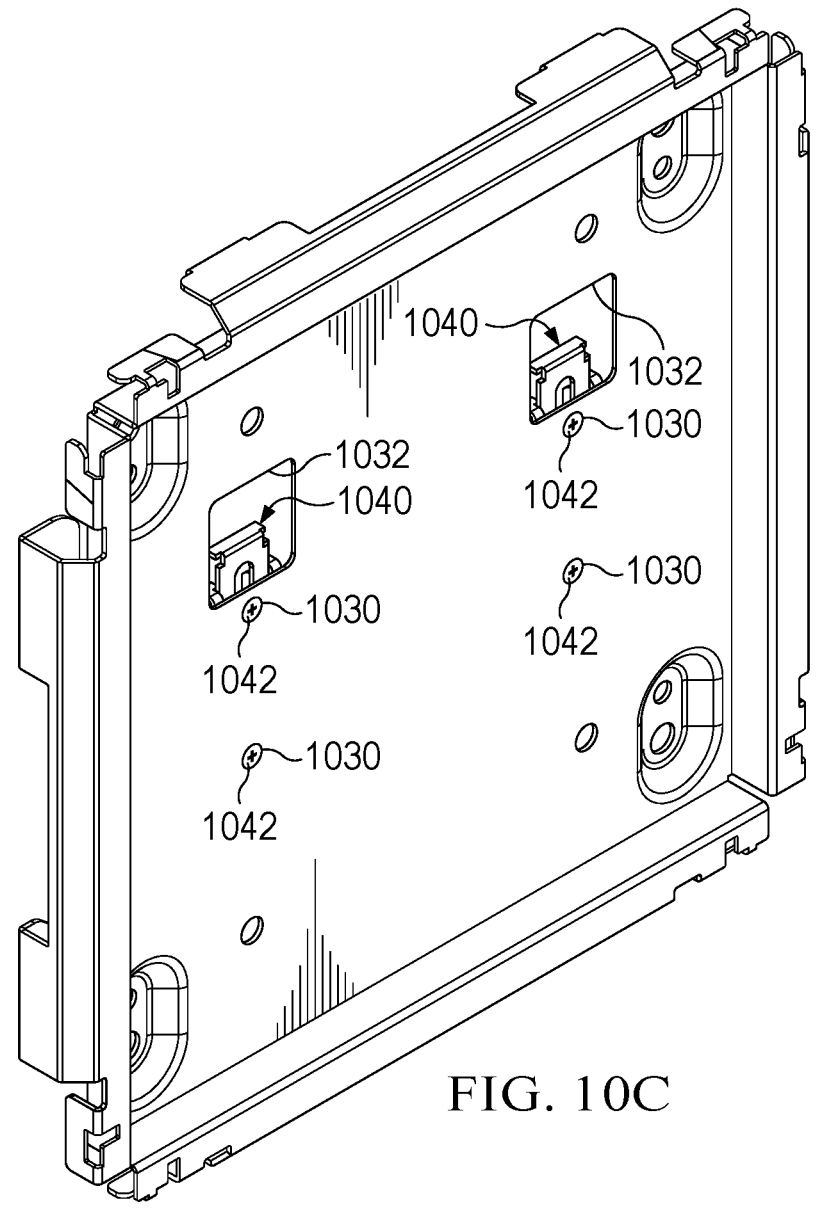

FIGS. 10B and 10C, generally referred to as FIG. 10, show perspective views of multi mount option mounting component 1012 when performing a rail mounting standard mounting operation. As used herein, an information handling system rail mounting standard mounting operation broadly refers to any task, function, procedure, or process performed, directly or indirectly to mount an information handling system to a rail mounting standard mounting rail using a multi mount option mounting system.

In certain embodiments, the multi mount option mounting bracket component 1020 defines one or more rail standard mounting clip apertures 1030. In certain embodiments, a pair of rail standard mounting clip fastener apertures 1030 is associated with a respective rail standard mounting visibility aperture 1032. In certain embodiments, the one or more rail standard mounting visibility apertures 1032 are configured to mate with respective rail standard mounting clips 1040. In certain embodiments, the one or more rail standard mounting fastener apertures 1032 are used to attach respective rail standard mounting clips to the multi mount option mounting bracket component 1020. In certain embodiments, the rail standard mounting clips 1040 are attached to the multi mount option mounting component 1020 via one or more fasteners 1042. In certain embodiments, the one or more fasteners include respective screws. In certain embodiments, the screws comprise M4 screws.

Figure 10D:
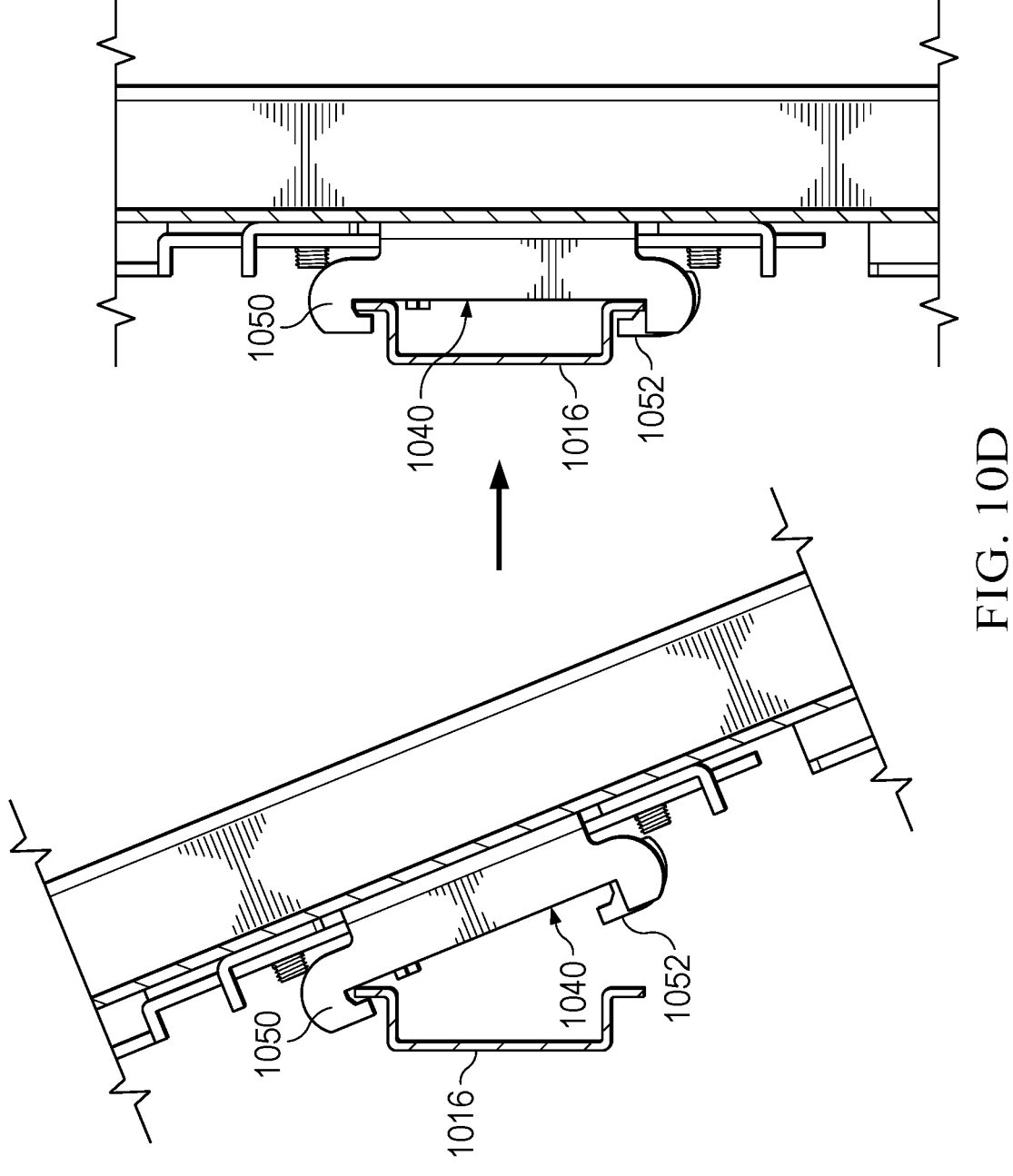
FIGS. 10D and 10E, generally referred to as FIG. 10, show a plurality of stages of rail mounting standard mounting operation in accordance with the present disclosure.
Figure 10E:
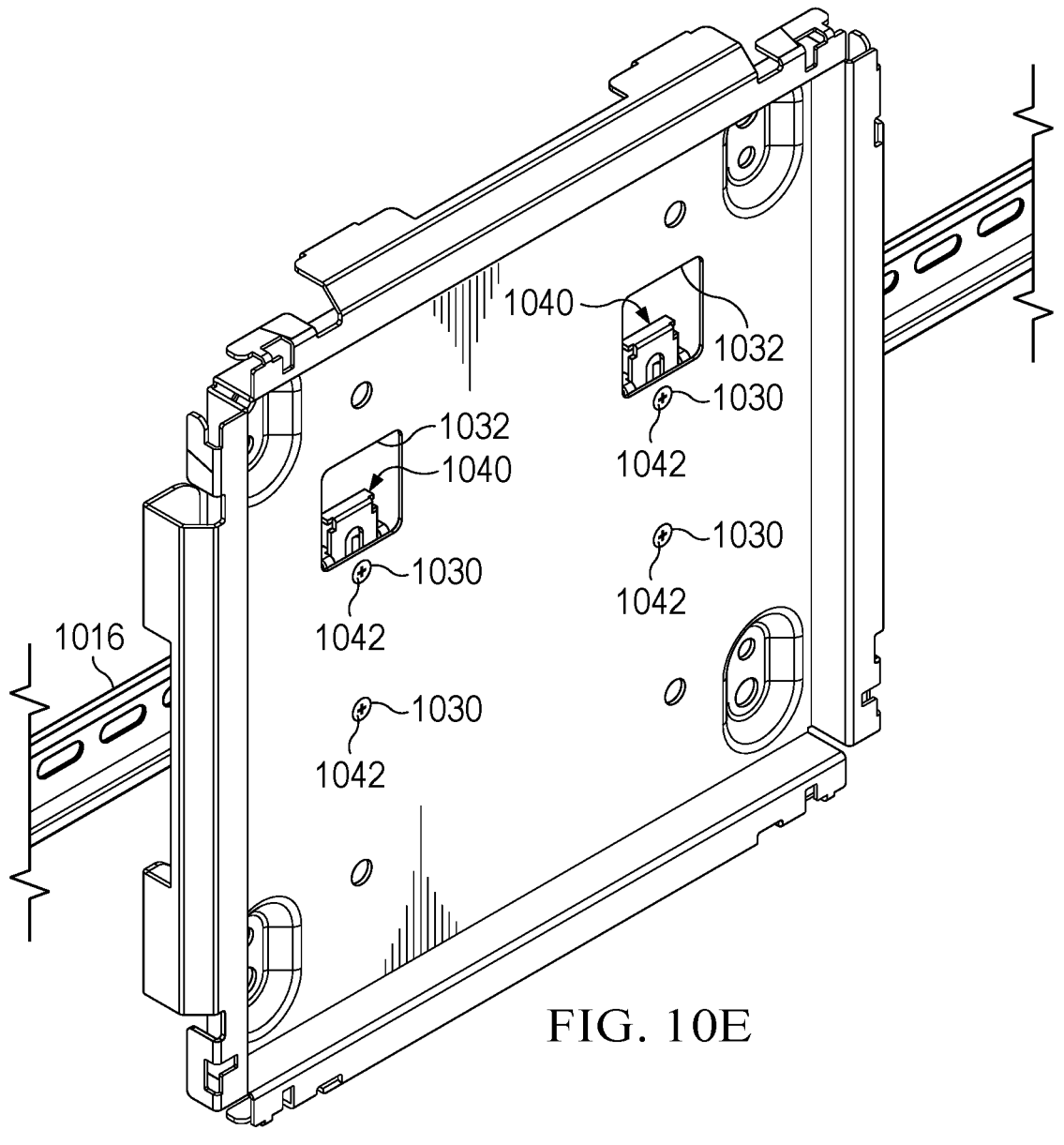

FIGS. 10D and 10E, generally referred to as FIG. 10, show a plurality of stages of rail mounting standard mounting operation. More specifically, when performing the rail mounting standard mounting operation, an upper hook 1050 of the rail standard mounting clip 1040 is engaged with a top edge of the rail mounting standard mounting rail. Next, pressure is applied to a latch 1052 on the rail standard mounting clip 1040 to cause a lower hoop 1054 of the rail standard mounting clip 1040 to engage with a bottom edge of the rail mounting standard mounting rail. An information handling system 1010, 1012, 1014 is attached to a respective multi mount option mounting component 1020 to attach the information handling system to the rail.

Figure 11A:
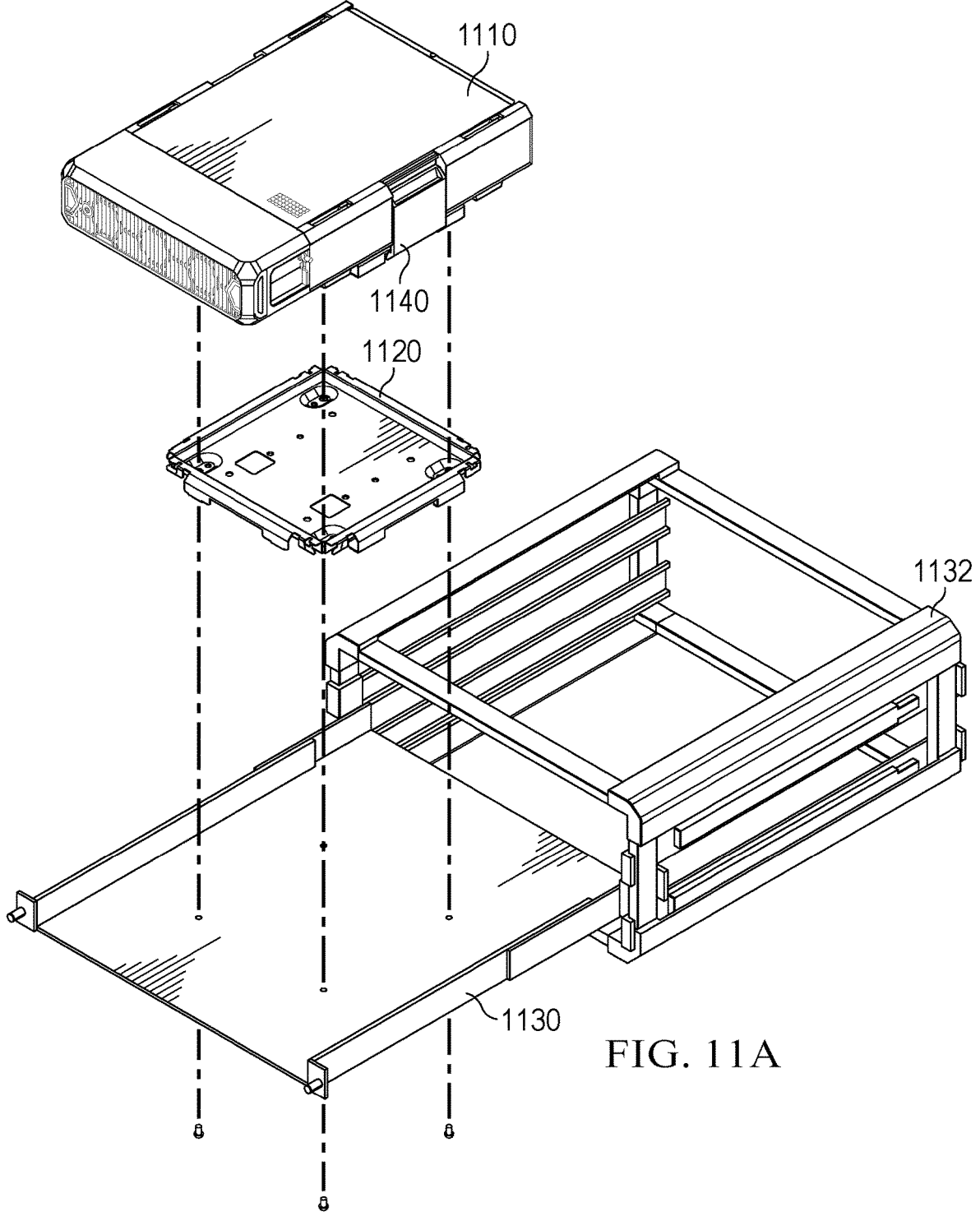
FIG. 11A, generally referred to as FIG. 11, shows an exploded perspective view of a transit case mounting standard mounting operation.

FIG. 11A, generally referred to as FIG. 11, shows an exploded perspective view of a transit case mounting standard mounting operation. As used herein, an information handling system transit case mounting operation broadly refers to any task, function, procedure, or process performed, directly or indirectly to mount an information handling system to a transit case using a multi mount option mounting system. In certain embodiments, the information handling system 1110 is physically attached to a multi mount option mounting component 1120 which is in turn physically attached to a shelf 1130 of a transit case 1132. In certain embodiments, side panels 1140 are used to attach the information handling system 1110 to the multi mount option mounting component 1120.

Figure 11B:
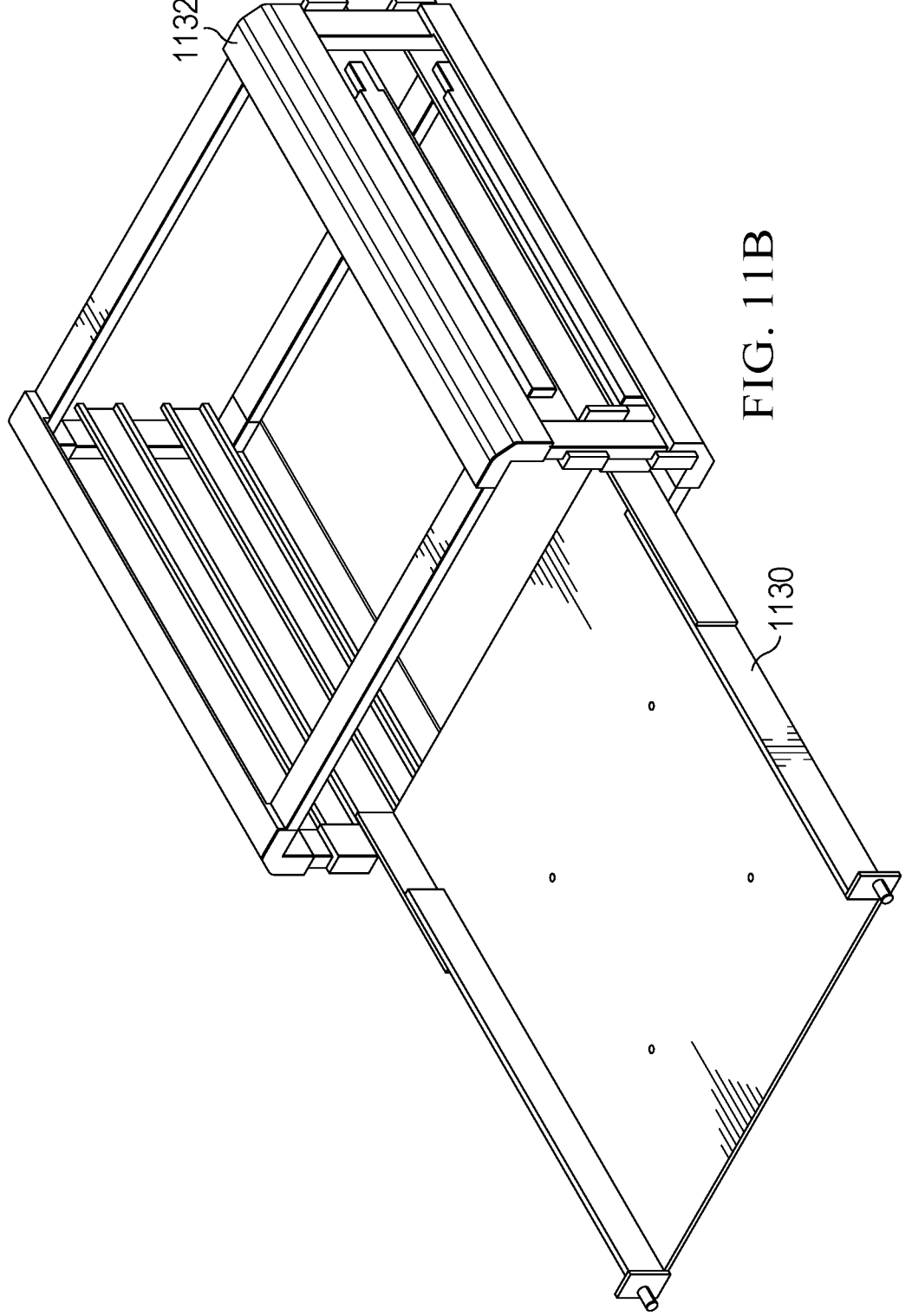
FIGS. 11B, 11C and 11D, generally referred to as FIG. 11, show a plurality of stages of transit case mounting operation in accordance with the present disclosure.
Figure 11C:
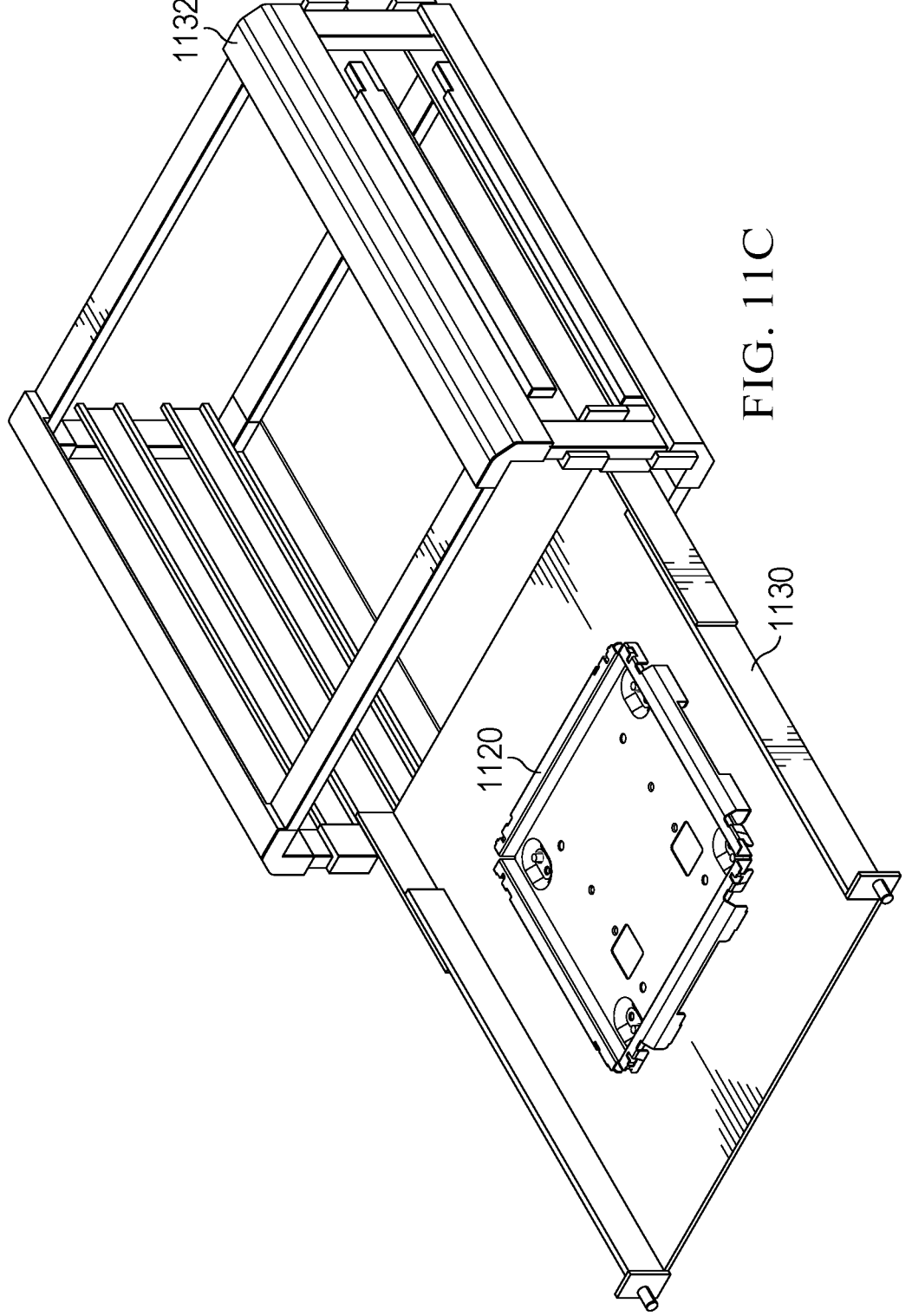
Figure 11D:
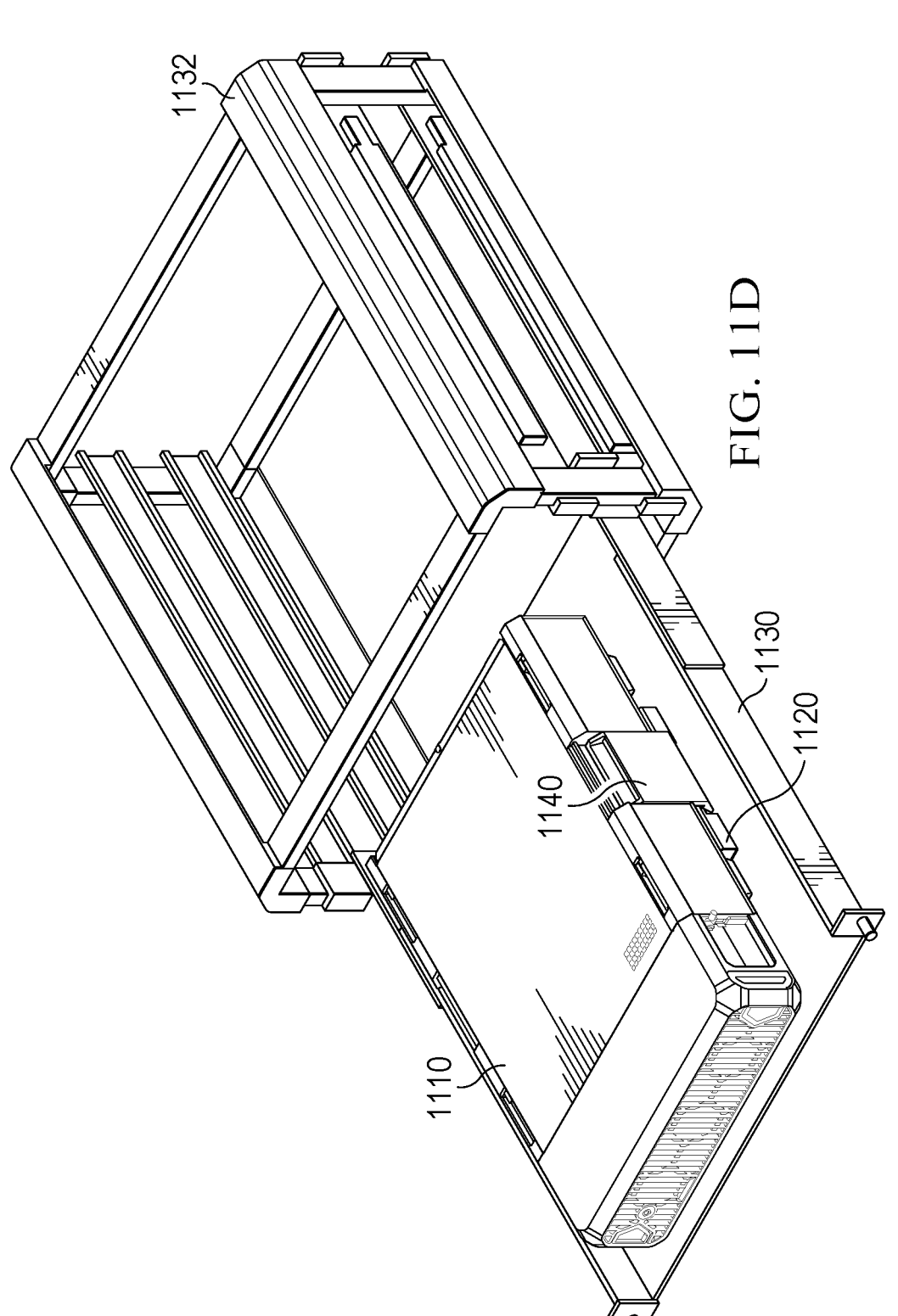

FIGS. 11B, 11C and 11D, generally referred to as FIG. 11, show a plurality of stages of transit case mounting operation in accordance with the present disclosure. In certain embodiments, multi mount option mounting component 1120 is attached to a sliding shelf 1130 of a transit case. The information handling system 1110 is then attached to the multi mount option mounting component 1120. Next, right and left side panel latches are inwardly rotated to cause a side panel latch to engage with the chassis of the information handling system 1110.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. An information handling system multi mount option mounting component, comprising:

a base panel, the base panel comprising a symmetric mounting feature, the symmetric mounting feature comprising a plurality of mounting apertures, the base panel being rectangularly shaped; and, an alignment feature, alignment feature comprising a plurality of mounting slots, the plurality of mounting slots including a right side server mounting slot and a left side server mounting slot, the right side server mounting slot extending parallel with and laterally along an edge of a right side of the base panel, the left side server mounting slot extending parallel with and laterally along an edge of a left side of the base panel, the plurality of mounting slots being configured to interact with alignment features of an information handling system chassis when the information handling system chassis is attached to the information handling system multi mount option mounting component; and wherein the information handling system multi mount option mounting component enables mounting of an information handling system via any of a plurality of different mounting options.

2. The information handling system multi mount option mounting component of claim 1, wherein:

the plurality of mounting slots are configured to interact with a respective plurality of multi mount option side panel mounting components, each of the plurality of multi mount option side panel mounting components interacting with the information handing system chassis when the information handling system chassis is attached to the information handling system multi mount option mounting component.

3. The information handling system multi mount option mounting component of claim 1, wherein:

the base panel of the information handling system multi mount option mounting component includes a plurality of foot projections, each of the plurality of foot projections defining a set of mounting apertures, the set of mounting apertures comprising a surface mount aperture and a video electronics standards association mount standard.

4. The information handling system multi mount option mounting component of claim 1, wherein:

the plurality of different mounting operations includes two or more of: a table mount option, a ceiling mount option, a wall mount option, a display standard mount option, a rail standard mount option and a transit case mount option.

5. The information handling system multi mount option mounting component of claim 4, wherein:

the display standard mount option conforms to a video electronics standards association mount standard.

6. The information handling system multi mount option mounting component of claim 4, wherein:

the rail standard mount option conforms to a Deutsches Institute fur Normung (DIN) mount standard.

7. An information handling system multi mount option mounting system, comprising:

an information handling system multi mount option mounting component, comprising:

a base panel, the base panel comprising a symmetric mounting feature, the symmetric mounting feature comprising a plurality of mounting apertures, the base panel being rectangularly shaped; and, an alignment feature, alignment feature comprising a plurality of mounting slots, the plurality of mounting slots including a right side server mounting slot and a left side server mounting slot, the right side server mounting slot extending parallel with and laterally along a right side of the base panel, the left side server mounting slot extending parallel with and laterally along a left side of the base panel, the plurality of mounting slots being configured to interact with alignment features of an information handling system chassis when the information handling system chassis is attached to the information handling system multi mount option mounting component; and wherein the information handling system multi mount option mounting component enables mounting of an information handling system via any of a plurality of different mounting options.

8. The information handling system multi mount option mounting system of claim 7, further comprising:

a plurality of multi mount option side panel mounting components, the plurality of mounting slots being configured to interact with the plurality of multi mount option side panel mounting components, each of the plurality of multi mount option side panel mounting components interacting with the information handling system chassis when the information handling system chassis is attached to the information handling system multi mount option mounting component.

9. The information handling system multi mount option mounting system of claim 7, wherein:

the base panel of the information handling system multi mount option mounting component includes a plurality of foot projections, each of the plurality of foot projections defining a set of mounting apertures, the set of mounting apertures comprising a surface mount aperture and a video electronics standards association mount standard.

10. The information handling system multi mount option mounting system of claim 7, wherein:

the plurality of different mounting operations includes two or more of: a table mount option, a ceiling mount option, a wall mount option, a display standard mount option, a rail standard mount option and a transit case mount option.

11. The information handling system multi mount option mounting system of claim 10, wherein:

the display standard mount option conforms to a video electronics standards association mount standard.

12. The information handling system multi mount option mounting system of claim 10, wherein:

the rail standard mount option conforms to a Deutsches Institute fur Normung (DIN) mount standard.

13. A system comprising:

an information handling system, the information handling system comprising:

a processor;

a data bus coupled to the processor;

a memory coupled to the processor; and an information handling system chassis, the information handling system chassis containing the processor and the memory; and an information handling system mounting system, comprising:

an information handling system multi mount option mounting component, comprising:

a base panel, the base panel comprising a symmetric mounting feature, the symmetric mounting feature comprising a plurality of mounting apertures, the base panel being rectangularly shaped; and, an alignment feature, alignment feature comprising a plurality of mounting slots, the plurality of mounting slots including a right side server mounting slot and a left side server mounting slot, the right side server mounting slot extending parallel with and laterally along a right side of the base panel, the left side server mounting slot extending parallel with and laterally along a left side of the base panel, the plurality of mounting slots being configured to interact with alignment features of the information handling system chassis when the information handling system chassis is attached to the information handling system multi mount option mounting component; and wherein the information handling system multi mount option mounting component enables mounting of the information handling system via any of a plurality of different mounting options.

14. The system of claim 13, wherein the information handling system mounting system further comprises:

a plurality of multi mount option side panel mounting components, the plurality of mounting slots being configured to interact with the plurality of multi mount option side panel mounting components, each of the plurality of multi mount option side panel mounting components interacting with the information handling system chassis when the information handling system chassis is attached to the information handling system multi mount option mounting component.

15. The system of claim 13, wherein:

the base panel of the information handling system multi mount option mounting component includes a plurality of foot projections, each of the plurality of foot projections defining a set of mounting apertures, the set of mounting apertures comprising a surface mount aperture and a video electronics standards association mount standard.

16. The system of claim 13, wherein:
the plurality of different mounting operations includes two or more of: a table mount option, a ceiling mount option, a wall mount option, a display standard mount option, a rail standard mount option and a transit case mount option.

17. The system of claim 16, wherein:
the display standard mount option conforms to a video electronics standards association mount standard.

18. The system of claim 16, wherein:
the rail standard mount option conforms to a Deutsches Institute fur Normung (DIN) mount standard.

\* \* \* \* \*